United States Patent
Wang et al.

(10) Patent No.: US 12,272,779 B2
(45) Date of Patent: Apr. 8, 2025

(54) WIRING SUBSTRATE, DISPLAY SUBSTRATE AND DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Jie Wang, Beijing (CN); Zouming Xu, Beijing (CN); Jian Tian, Beijing (CN); Chunjian Liu, Beijing (CN); Xintao Wu, Beijing (CN); Jie Lei, Beijing (CN); Jianying Zhang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/785,522

(22) PCT Filed: Sep. 2, 2021

(86) PCT No.: PCT/CN2021/116166
§ 371 (c)(1),
(2) Date: Jun. 15, 2022

(87) PCT Pub. No.: WO2023/028938
PCT Pub. Date: Mar. 9, 2023

(65) Prior Publication Data
US 2024/0194842 A1 Jun. 13, 2024

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 25/167* (2013.01); *H01L 27/1244* (2013.01)

(58) Field of Classification Search
CPC ............... H01L 27/1244; H01L 25/167; H01L 25/0753; H01L 25/075; H01L 33/62; G02F 1/1345
See application file for complete search history.

(56) References Cited

U.S. PATENT DOCUMENTS 10,066,819 B2 9/2018 Cok
11,074,881 B2 * 7/2021 Takahashi ............ G09G 3/3688
(Continued)

FOREIGN PATENT DOCUMENTS

CN 110164351 A 8/2019
CN 110649059 A 1/2020
(Continued)

OTHER PUBLICATIONS

Office Action in TW111133451, mailed Aug. 16, 2023, 7 pages.

*Primary Examiner* — Vinh T Lam
(74) *Attorney, Agent, or Firm* — ArentFox Schiff LLP; Michael Fainberg

(57) ABSTRACT

A wiring substrate includes: a base substrate; and a plurality of control areas on one side of the base substrate, each of the plurality of control areas extending in a first direction, the plurality of control areas being sequentially arranged in a second direction, and any one of the plurality of control areas including: a plurality of drive circuit pad groups sequentially arranged in the first direction; a plurality of functional element pad groups, each of which being electrically connected with the corresponding drive circuit pad group; a plurality of signal lines, main bodies of which extend in the first direction; and first connection lines, each of which is configured to cascade two drive circuit pad (Continued)

groups adjacent in the first direction, orthographic projections of the first connection lines on the base substrate not overlapping with orthographic projections of the signal lines on the base substrate.

20 Claims, 24 Drawing Sheets

(51) Int. Cl.
*H01L 25/16* (2023.01)
*H01L 27/12* (2006.01)

(56) References Cited

U.S. PATENT DOCUMENTS

| | | | |
|---|---|---|---|
| 11,333,910 B2* | 5/2022 | Fujikawa | G02F 1/1368 |
| 11,411,151 B2* | 8/2022 | Sun | H01L 27/156 |
| 11,581,296 B2* | 2/2023 | Lei | G09G 3/342 |
| 11,651,743 B2* | 5/2023 | Yang | G09G 3/2088 |
| | | | 345/691 |
| 2015/0339998 A1 | 11/2015 | Yen et al. | |
| 2019/0244906 A1* | 8/2019 | Min | H01L 23/49811 |
| 2021/0240049 A1 | 8/2021 | Abe et al. | |
| 2022/0320056 A1* | 10/2022 | Liang | H01L 24/85 |
| 2022/0359402 A1* | 11/2022 | Zeng | H01L 25/0753 |
| 2023/0387140 A1* | 11/2023 | Wang | H01L 27/124 |

FOREIGN PATENT DOCUMENTS

| | | |
|---|---|---|
| CN | 110831342 A | 2/2020 |
| CN | 111123591 A | 5/2020 |
| CN | 111446283 A | 7/2020 |
| CN | 111583852 A | 8/2020 |
| CN | 112272790 A | 1/2021 |
| CN | 113130463 A | 7/2021 |
| TW | 201545323 A | 12/2015 |

* cited by examiner

WIRING SUBSTRATE, DISPLAY SUBSTRATE AND DISPLAY APPARATUS

CROSS-REFERENCE TO RELATED APPLICATION

This application is a national phase entry under 35 U.S.C. § 371 of International Application No. PCT/CN2021/116166, filed on Sep. 2, 2021, the entire content of which is incorporated herein by reference.

FIELD

The disclosure relates to the technical field of semiconductors, and in particular to a wiring substrate, a display substrate and a display apparatus.

BACKGROUND

With the mini light-emitting diode (Mini LED) technology growing increasingly mature, display and backlight products of glass-based Mini LEDs are developed by panel factories at present. Active drive product, due to higher efficiency, larger-area drive, better brightness uniformity and greater contrast ratio, is a preferred solution of the drive circuit for the large-size Mini LED backlight product.

SUMMARY

The disclosure provides a wiring substrate, a display substrate and a display apparatus.

The wiring substrate includes:
a base substrate; and
a plurality of control areas on a side of the base substrate, each of the plurality of control areas extending in a first direction, the plurality of control areas being sequentially arranged in a second direction, and any one of the plurality of control areas including:
  a plurality of drive circuit pad groups sequentially arranged in the first direction;
  a plurality of functional element pad groups, each of which is electrically connected with a corresponding drive circuit pad group;
  a plurality of signal lines, main bodies of which extend in the first direction; and
  first connection lines, each of which is configured to cascade two drive circuit pad groups adjacent in the first direction, where an orthographic projection of the first connection line on the base substrate not overlapping with an orthographic projection of the signal line on the base substrate.

In one possible implementation, the signal line includes a ground signal line and a power supply signal line, the ground signal line and the power supply signal line being located at two sides of the drive circuit pad group respectively; and the drive circuit pad group includes a ground pad and a power supply pad. The drive circuit pad group includes a ground pad and a power supply pad, where the ground pad is located at a side of the power supply pad close to the ground signal line, the ground pad is electrically connected with the ground signal line, and the power supply pad is electrically connected with the power supply signal line.

In one possible implementation, the wiring substrate includes a binding area. The drive circuit pad group further includes an input pad and an output pad, where the output pad is located at a position of the drive circuit pad group close to the functional element pad group.

In one possible implementation, arrangement modes of the input pad, the output pad, the ground pad and the power supply pad are different in the drive circuit pad groups of two adjacent control areas of the plurality of control areas.

In one possible implementation, the plurality of control areas include a first control area and a second control area adjacent in the second direction. A plurality of drive circuit pad groups in the first control area are sequentially connected in cascade in the first direction from a side close to the binding area, and a plurality of drive circuit pad groups in the second control area are sequentially connected in cascade in the first direction from a side far away from the binding area. A drive circuit pad group in the first control area farthest away from the binding area is connected in cascade with a drive circuit pad group in the second control area farthest away from the binding area. In the drive circuit pad group in the first control area, the output pad and the input pad are located in different rows, and in the drive circuit pad group in the second control area, the output pad and the input pad are located in a same row.

In one possible implementation, in the drive circuit pad group in the first control area, the output pad and the power supply pad are located in a same row, and the output pad and the ground pad are located in a same column. In the drive circuit pad group in the second control area, the output pad and the input pad are located in a same row, and the output pad and the ground pad are located in a same column.

In one possible implementation, in the drive circuit pad group in the first control area, the output pad and the ground pad are located in a same row, and the output pad and the power supply pad are located in a same column. In the drive circuit pad group in the second control area, the output pad and the input pad are located in a same row, and the output pad and the ground pad are located in a same column.

In one possible implementation, in at least one of the plurality of control areas, the first connection line includes a first connection sub-segment and a second connection sub-segment. An orthographic projection of the first connection sub-segment on the base substrate overlaps with an orthographic projection of the drive circuit pad group on the base substrate, an end of the first connection sub-segment is electrically connected with the output pad, and another end of the first connection sub-segment is electrically connected with the second connection sub-segment; and another end of the second connection sub-segment is electrically connected with an input pad of a next stage of drive circuit pad group.

In one possible implementation, a main body of the first connection sub-segment extends in the first direction, and an orthographic projection of the first connection sub-segment on the base substrate is located at a gap between an orthographic projection of the ground pad on the base substrate and an orthographic projection of the power supply pad on the base substrate.

In one possible implementation, a width of the first connection sub-segment in the second direction is ⅕ to ½ of a minimum spacing between the ground pad and the power supply pad.

In one possible implementation, a minimum spacing between the ground pad and the power supply pad in the second control area is greater than a minimum spacing between the ground pad and the input pad in the first control area.

In one possible implementation, the wiring substrate includes a second connection line. The drive circuit pad group in the first control area farthest away from the binding area is connected in cascade with the drive circuit pad group in the second control area farthest away from the binding area via the second connection line.

In one possible implementation, the second control area includes a first drive circuit pad group farthest from the binding area and a first functional element pad group farthest from the binding area, the second connection line extends in the second direction and is located in a gap between the first drive circuit pad group and the first functional element pad group. The second control area further includes an output connection line electrically connecting the first drive circuit pad group and the first functional element pad group, and a bridging portion in a different layer from the second connection line. The output connection line includes a first output connection sub-line and a second output connection sub-line disposed in a same layer as the second connection line and extending in the first direction, where an end of the first output connection sub-line is electrically connected with the output pad of the drive circuit pad group, an end of the second output connection sub-line is electrically connected with the functional element pad group, and another end of the first output connection sub-line is electrically connected with another end of the second output connection sub-line via the bridging portion.

In one possible implementation, the second control area includes a first drive circuit pad group farthest from the binding area, and a first functional element pad group farthest from the binding area; and the second connection line extends in the second direction and is located at a side of the first functional element pad group far away from the first drive circuit pad group.

In one possible implementation, an arrangement mode of the input pad, the output pad, the ground pad, and the power supply pad in the drive circuit pad group in the first control area and an arrangement mode of the input pad, the output pad, the ground pad and the power supply pad in the drive circuit pad group in the second control area are in a mirror symmetry manner.

In one possible implementation, the plurality of control areas include a third control area and a fourth control area adjacent in the second direction, where a plurality of drive circuit pad groups in the third control area are sequentially connected in cascade in the first direction from the side close to the binding area, a plurality of drive circuit pad groups in the fourth control area are sequentially connected in cascade in the first direction from the side close to the binding area. A power supply signal line connected with an elements in the third control area and a power supply signal line connected with an element in the fourth control area are located in a gap between a ground signal line connected with an element in the third control area and a ground signal line connected with an element in the fourth control area.

In one possible implementation, the third control area and the fourth control area share the same power supply signal line.

In one possible implementation, the third control area and the fourth control area are arranged in a mirror symmetry mode.

In one possible implementation, in the drive circuit pad group of the third control area, the output pad and the power supply pad are located in a same row, and the output pad and the ground pad are located in a same column.

In one possible implementation, the wiring substrate further includes a power line at a side of the functional element pad group far away from the power supply signal line, where the functional element pad groups in a same control area are electrically connected with a same power line.

In one possible implementation, the functional element pad group includes a plurality of pad sub-groups sequentially connected in series.

An embodiment of the disclosure further provides a display substrate, including the wiring substrate provided in an embodiment of the disclosure, where each of the functional element pad groups includes a plurality of pad sub-groups sequentially connected in series. The display substrate further includes drive circuits in binding connection with the drive circuit pad groups, and light-emitting elements in binding connection with the pad sub-groups.

An embodiment of the disclosure further provides a display apparatus, including the display substrate provided in an embodiment of the disclosure.

DETAILED DESCRIPTION

Figure 1A:
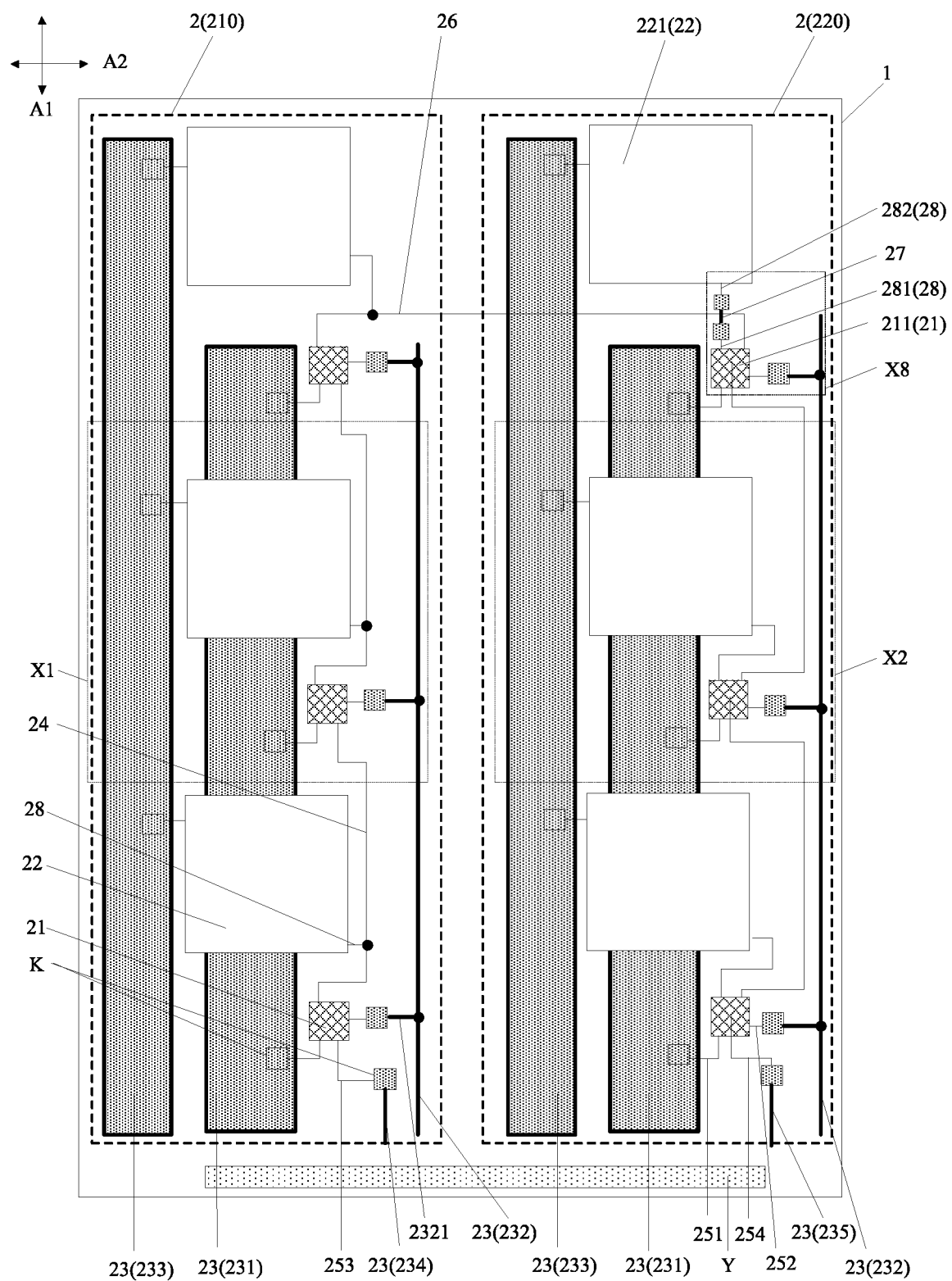
FIG. 1A is a first schematic top view of a wiring substrate provided in an embodiment of the disclosure.

In order to make the objectives, technical solutions and advantages of embodiments of the disclosure more clear, the technical solutions in the embodiments of the disclosure will be clearly and completely described below in combination with the drawings in the embodiments of the disclosure. Apparently, the embodiments described are merely some rather than all of the embodiments of the disclosure. On the basis of the embodiments of the disclosure described, all other embodiments obtained by those of ordinary skill in the art without making creative efforts all fall within the scope of protection of the disclosure.

Unless otherwise defined, technical or scientific terms used in the disclosure have the ordinary meanings as understood by those of ordinary skill in the art to which the disclosure belongs. "First", "second" and similar words used in the disclosure do not mean any order, quantity or importance, but are only used for distinguishing different components. Similar words of "comprise", "include", etc. mean that elements or items appearing before the word encompass elements or items listed after the word and their equivalents without excluding other elements or items. Similar words of "connecting", "connection", etc. are not limited to physical or mechanical connections, but may include electrical connections whether direct or indirect. "Upper", "lower", "left", "right", etc. are only used to represent a relative position relation. After an absolute position of a described object is changed, the relative position relation may also be changed accordingly.

In order to maintain the following description of the embodiments of the disclosure clear and concise, the disclosure omits a detailed description of known functions and known components.

The disclosure relates to a semiconductor product, in particular to a product including a plurality of components. Specifically, the plurality of components are divided into different functional element areas respectively, and at least one functional element area is controlled by a driving chip. According to functions of each of pins of each of the driving chips and working modes of the drive chips, the product includes signal lines for providing electrical signals for the drive chips and the functional element areas respectively, and connection lines for achieving electrical connection between the drive chips and the functional element areas, or between different driving chips.

It may be understood that in order to facilitate layout design, circuits having different functions may be located at different layers respectively. For example, the signal lines and the connection lines are located at different film layers respectively, thereby ensuring that the circuits having different functions have sufficient wiring space, and ensuring stability and reliability of electrical connection. However, when the circuits in the product are distributed in different film layers, if the circuits located in different layers overlap in space, a capacitor (C) structure may be formed, and each layer of circuit has a resistor (R). On one hand, under combined action of R and C, serious transmission delay (RC-delay) of the circuits may be generated; and on the other hand, although insulating layers are disposed between different layers of circuits, a short circuit may occur due to an influence of a technological process, etc.

For the semiconductor product including a functional element, in some cases, it is necessary to connect and fix the functional element to a back plate after manufacturing each of film layers including circuits on the back plate. Therefore, before the functional element is arranged, the back plate includes a pad structure to be electrically connected with the functional element. However, since it is required to electrically connect the pad structure to the functional element, a surface of the pad structure is exposed and tends to be invaded by foreign matters and water vapor from an environment. Further, since the pad structure is usually disposed in the same layer and made of the same material as a certain circuit, a short circuit or failure of the circuit tends to occur, thereby seriously affecting reliability of the product.

Figure 1B:
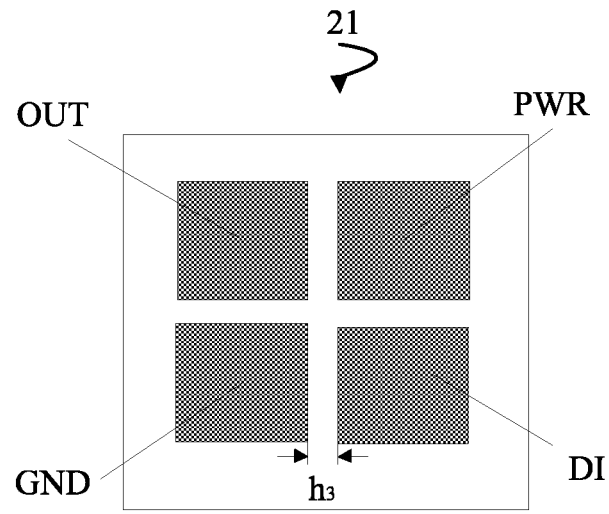
FIG. 1B is an enlarged view of a drive circuit pad group 21 in a control area 2 on a left side in FIG. 1A.
Figure 1C:
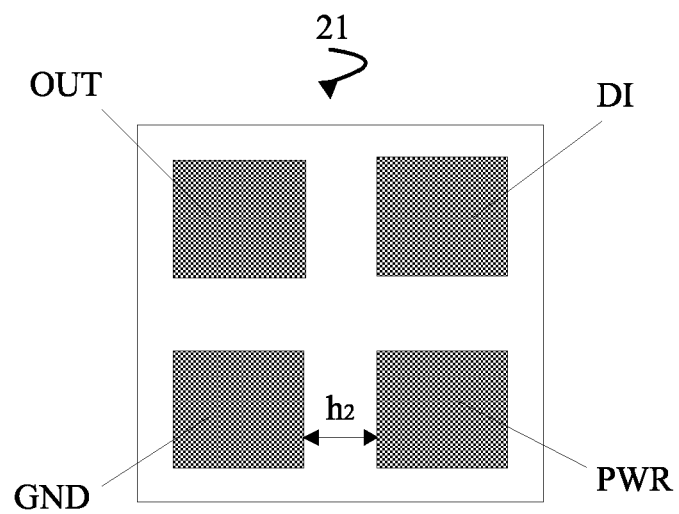
FIG. 1C is an enlarged view of a drive circuit pad group 21 in a control area 2 on a right side in FIG. 1A.
Figure 1D:
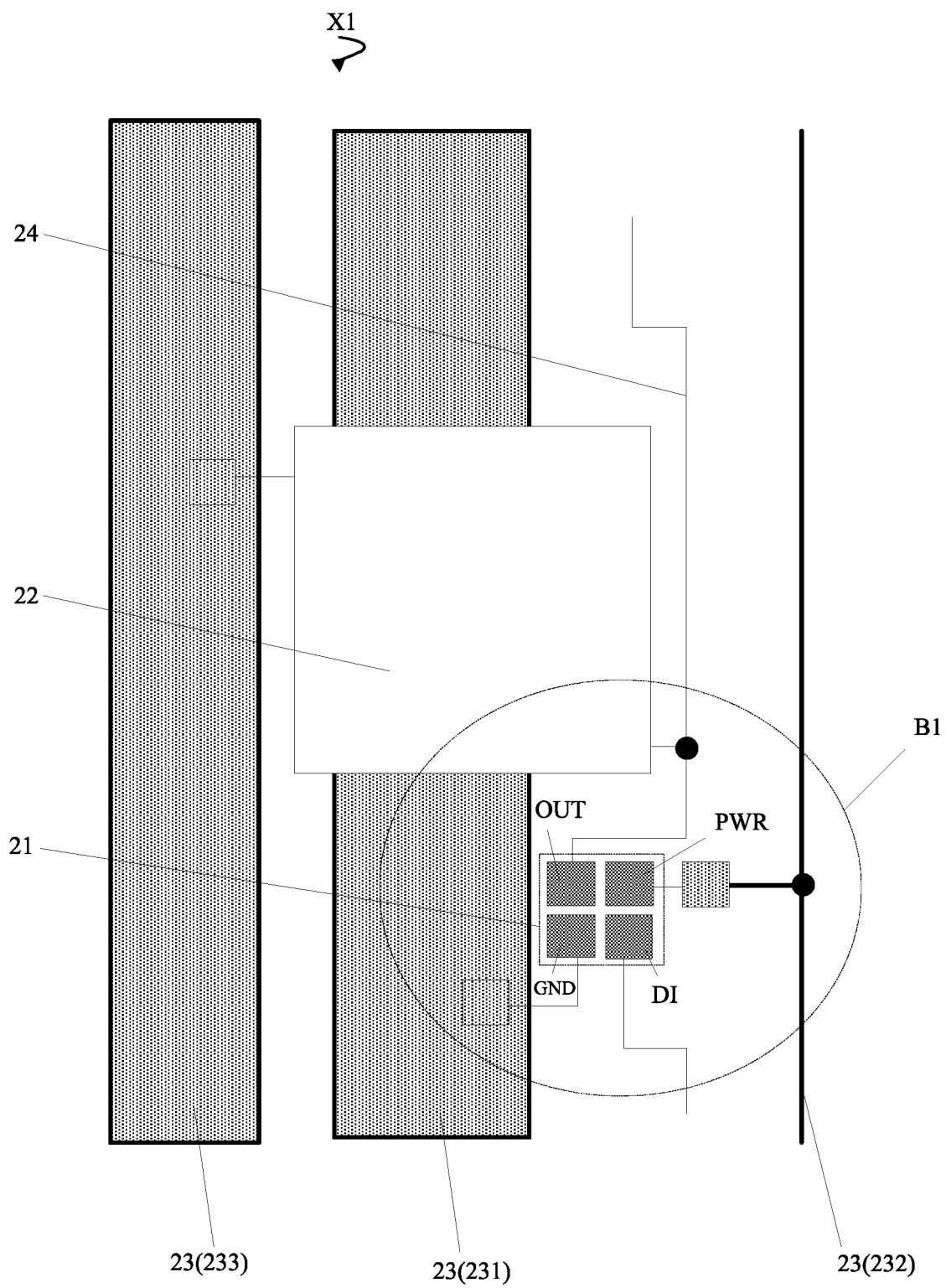
FIG. 1D is an enlarged view of the structure shown in a dashed box X1 in FIG. 1A.
Figure 1E:
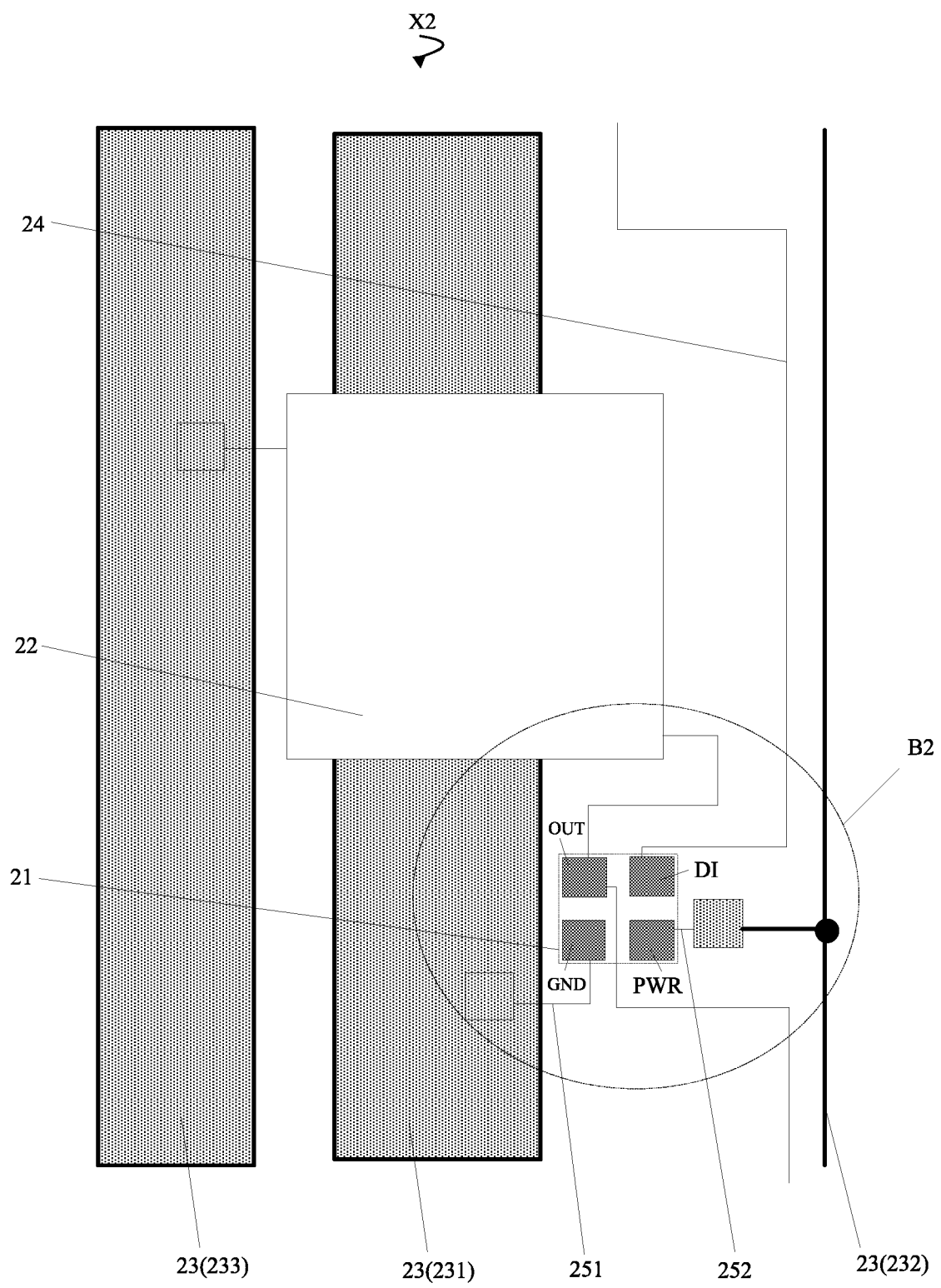
FIG. 1E is an enlarged view of the structure shown in a dashed box X2 in FIG. 1A.
Figure 2A:
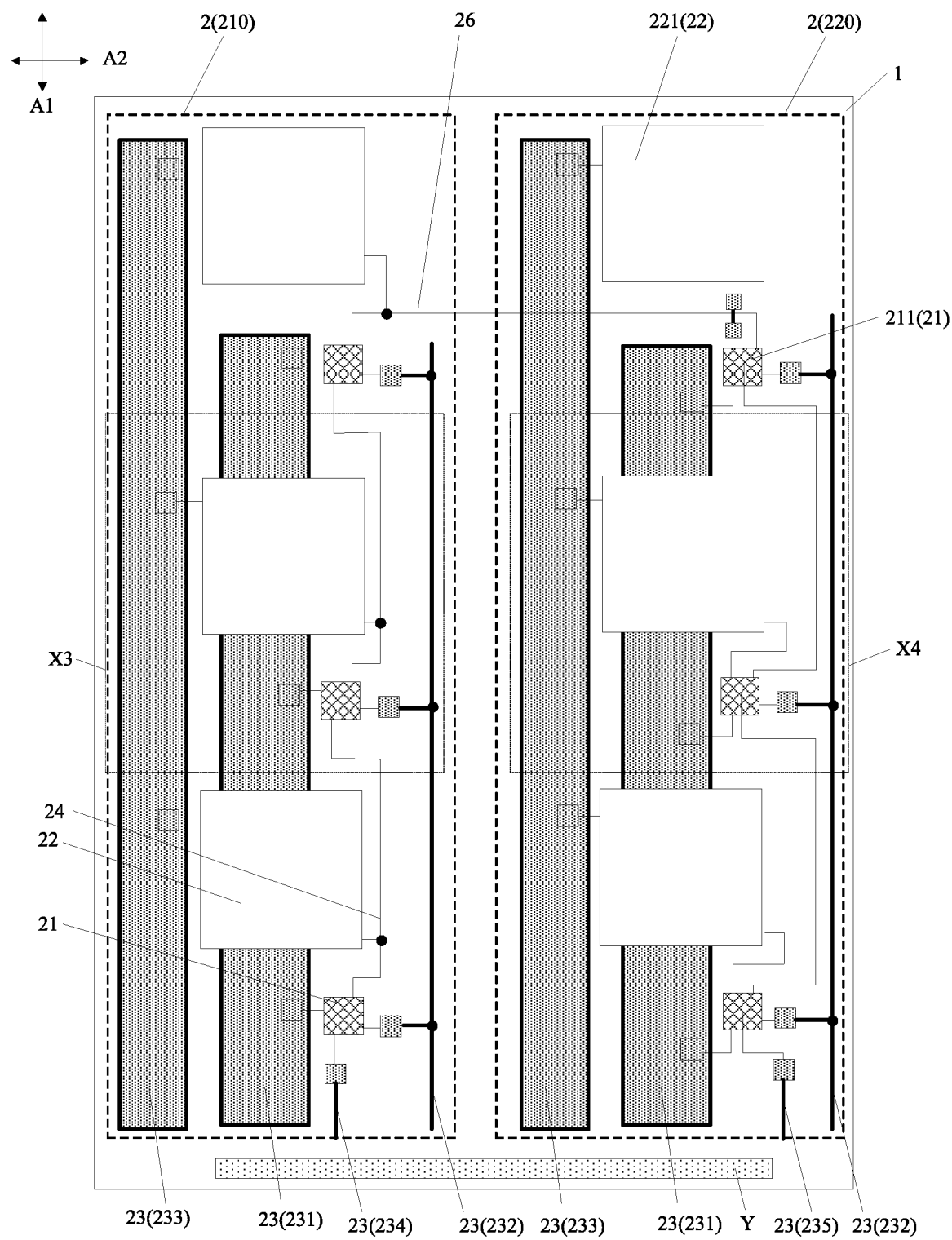
FIG. 2A is a second schematic top view of a wiring substrate provided in an embodiment of the disclosure.
Figure 2B:
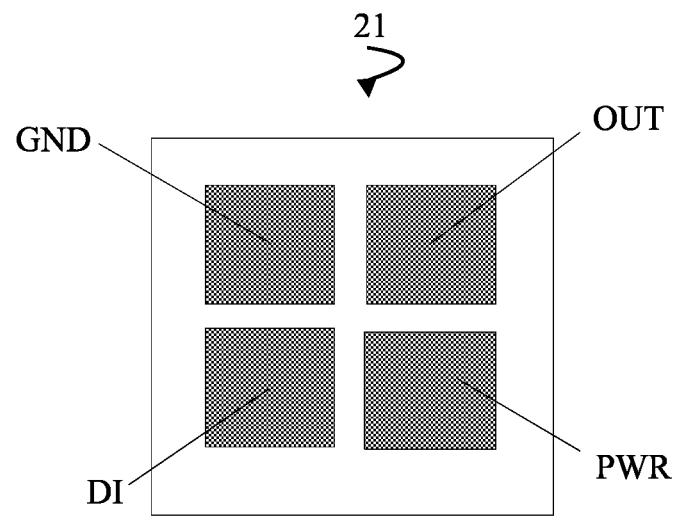
FIG. 2B is an enlarged view of a drive circuit pad group 21 of a control area 2 on a left side in FIG. 2A.
Figure 2C:
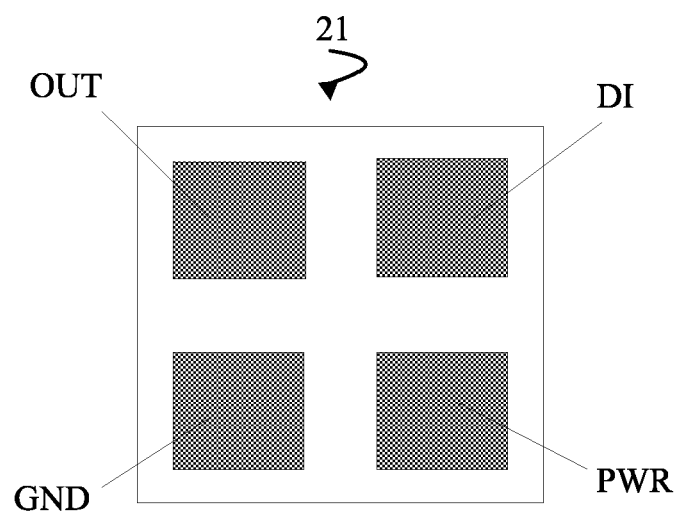
FIG. 2C is an enlarged view of a drive circuit pad group 21 of a control area 2 on a right side in FIG. 2A.
Figure 2D:
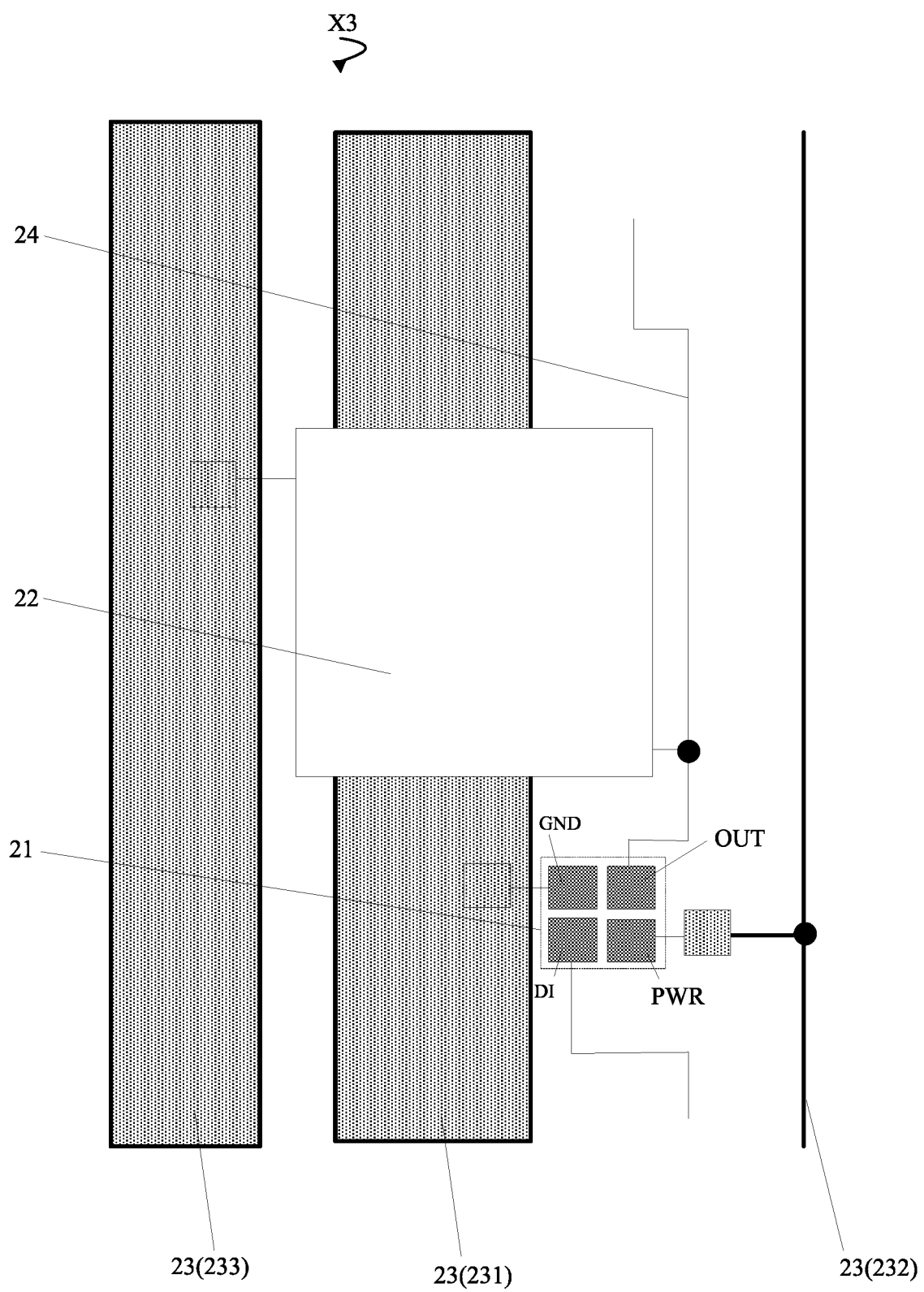
FIG. 2D is an enlarged view of the structure shown in a dashed box X3 in FIG. 2A.
Figure 2E:
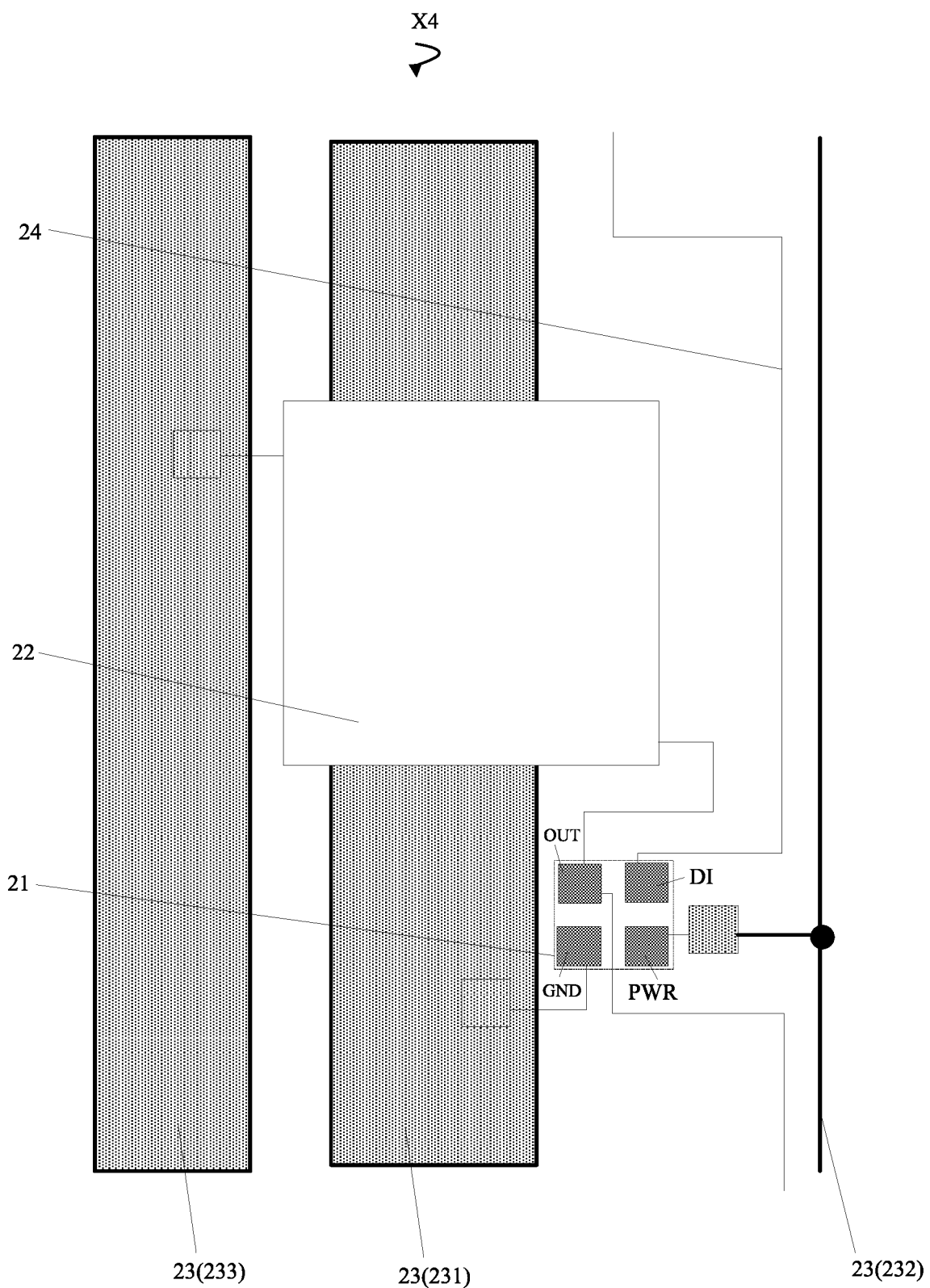
FIG. 2E is an enlarged view of the structure shown in a dashed box X4 in FIG. 2A.
Figure 3A:
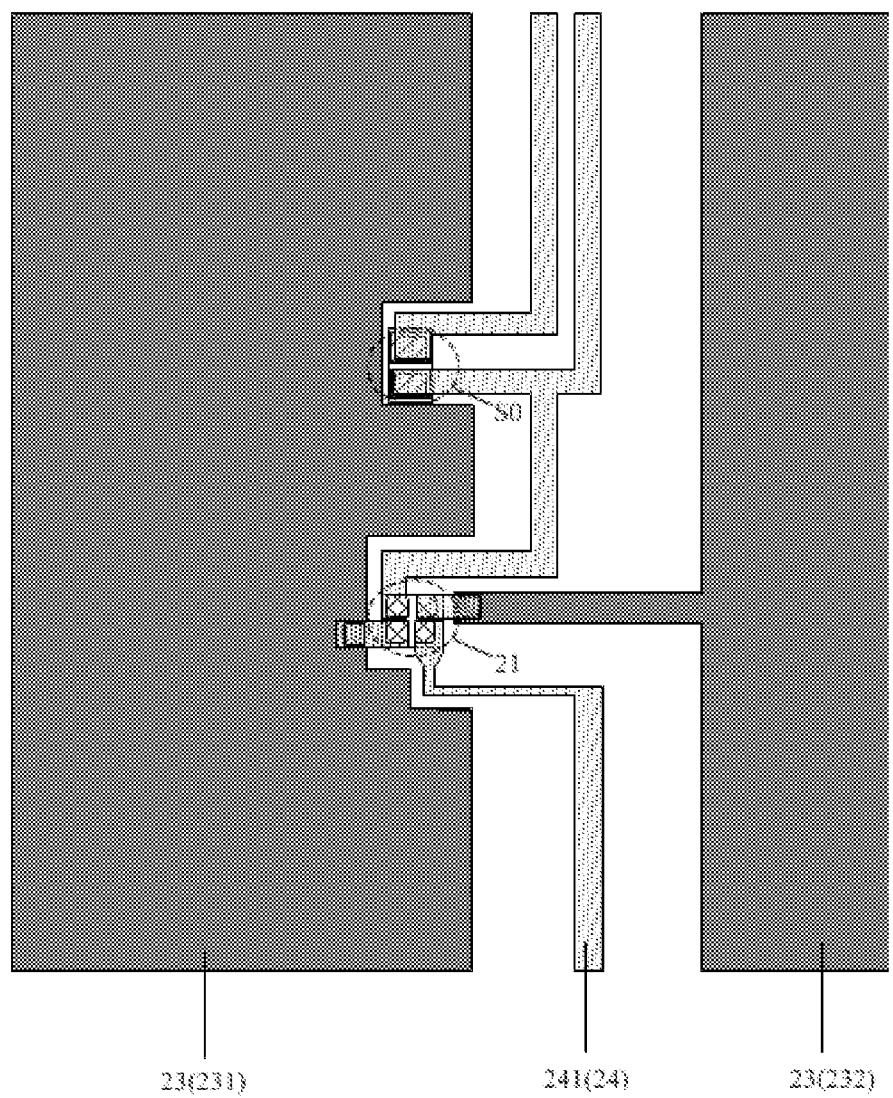
FIG. 3A is an enlarged view of the structure shown in a dashed circle B1 in FIG. 2D.
Figure 3B:
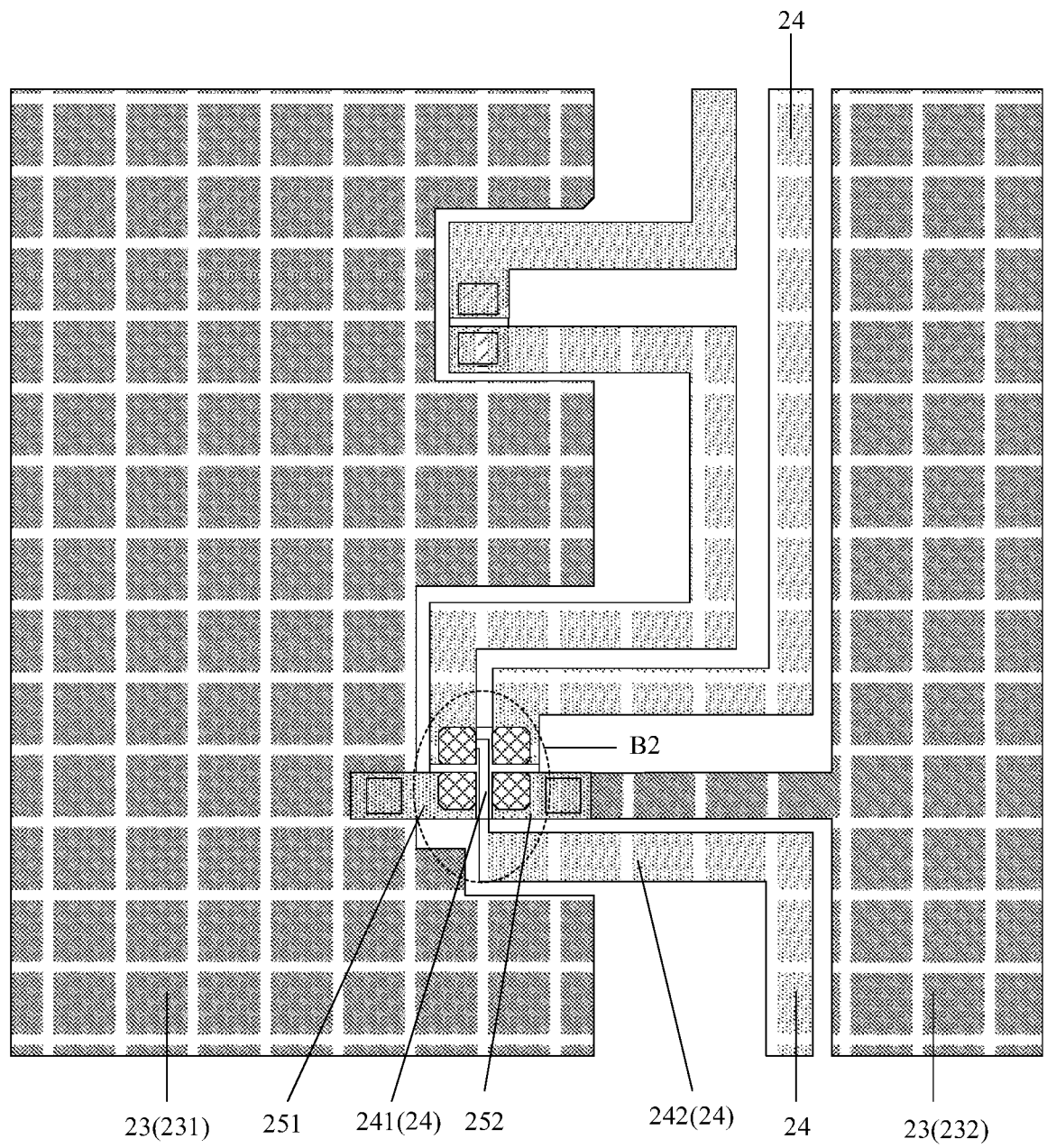
FIG. 3B is an enlarged view of the structure shown in a dashed circle B2 in FIG. 2E.
Figure 3C:
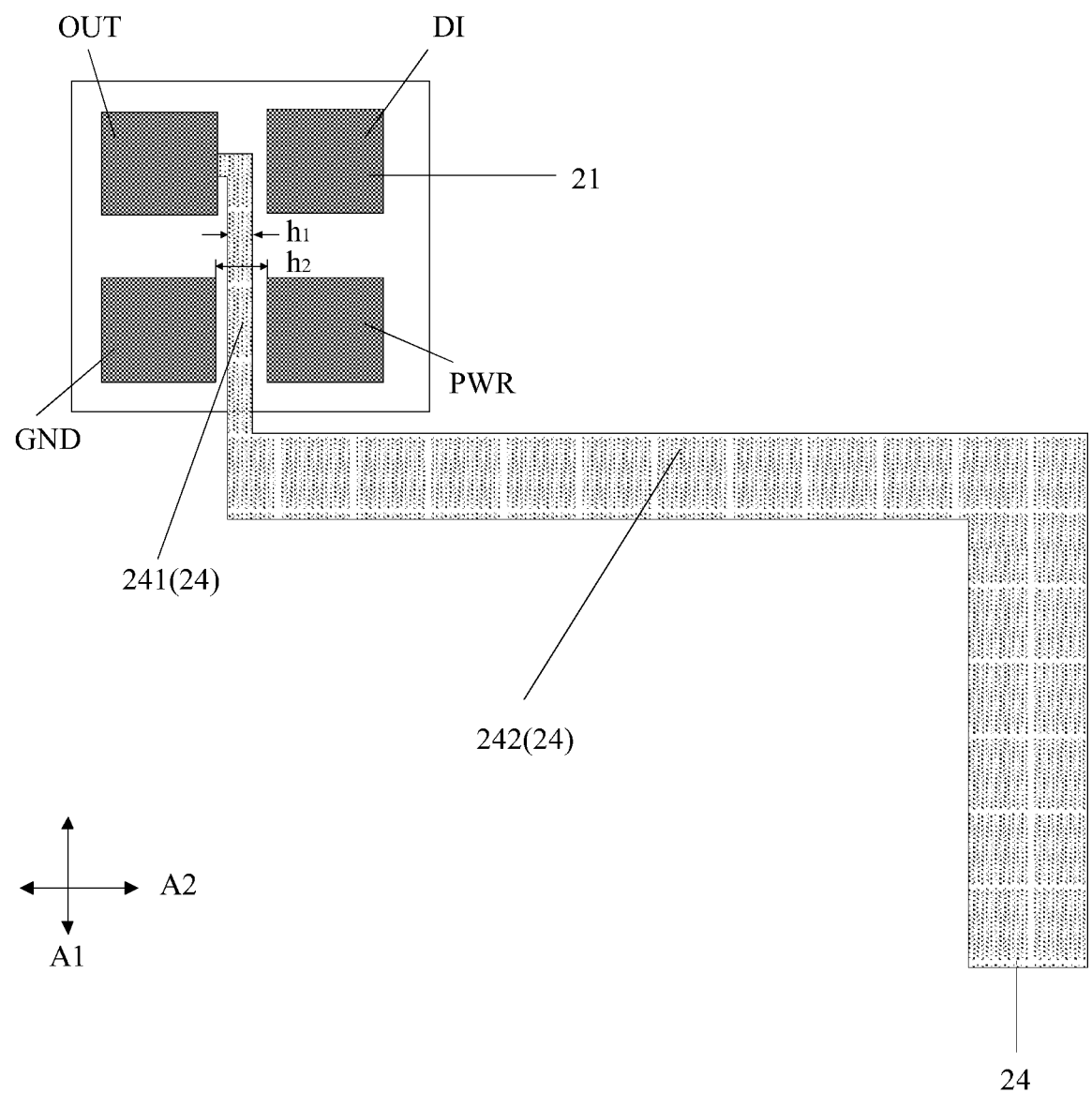
FIG. 3C is an enlarged view of the structure shown in a dashed circle B3 in FIG. 3B.

In view of the above, with reference to FIGS. TA, 1B, 1C, 1D, 1E, 2A, 2B, 2C, 2D, 2E, 3A, 3B, and 3C, in which FIG. 1B is an enlarged view of a drive circuit pad group 21 of a control area 2 on a left side in FIG. TA, FIG. 1C is an enlarged view of a drive circuit pad group 21 of a control area 2 on a right side in FIG. TA, FIG. 1D is an enlarged view of the structure shown in a dashed box X1 in FIG. TA, FIG. 1E is an enlarged view of the structure shown in a dashed box X2 in FIG. TA, FIG. 2B is an enlarged view of a drive circuit pad group 21 of a control area 2 on a left side in FIG. 2A, FIG. 2C is an enlarged view of a drive circuit pad group 21 of a control area 2 on a right side in FIG. 2A, FIG. 2D is an enlarged view of the structure shown in a dashed box X3 in FIG. 2A, FIG. 2E is an enlarged view of the structure shown in a dashed box X4 in FIG. 2A, FIG. 3A is an enlarged view of the structure shown in a dashed circle B1 in FIG. 2D, FIG. 3B is an enlarged view of the structure shown in a dashed circle B2 in FIG. 2E, and FIG. 3C is an enlarged view of the structure shown in a dashed circle B3 in FIG. 3B, an embodiment of the disclosure provides a wiring substrate. The wiring substrate includes:

a base substrate 1; and a plurality of control areas 2 on a side of the base substrate 1, each control area 2 of the plurality of control areas 2 extending in a first direction A1, the plurality of control areas 2 being sequentially arranged in a second direction A2, and any one control area 2 of the plurality of control areas 2 including:

a plurality of drive circuit pad groups 21 sequentially arranged in the first direction A1, where, each of the drive circuit pad groups 21 may include a plurality of pads, which are used for being correspondingly connected with a plurality of pins of a drive circuit; for example, the drive circuit includes an input pin, an output pin, a ground pin, and a power supply pin, and correspondingly, each of the drive circuit pad groups may include an input pad DI, an output pad OUT, a ground pad GND, and a power supply pad PWR; specifically, the input pad DI is used for being correspondingly connected with the input pin, the output pad OUT is used for being correspondingly connected with the output pin, the ground pad GND is used for being connected with the ground pin, and the power supply pad PWR is used for being correspondingly connected with the power supply pin; and the wiring substrate may provide an address signal for the drive circuit via the input pad DI, provide working voltage for the drive circuit and transmit data signals via the power supply pad PWR, where the data signal may be used for controlling a working state of a corresponding functional element, and a reference potential voltage for the drive circuit is provided via the ground pad GND, as such the drive circuit may transmit a relay address signal to the input pad DI of a next stage of drive circuit via the output pad OUT in a first time period and a signal loop with the functional element may be formed in a second time period;

a plurality of functional element pad groups 22, each of the functional element pad groups 22 being electrically connected with the corresponding drive circuit pad group 21, where, each functional element pad group 22 may include a plurality of pad sub-groups;

a plurality of signal lines 23, main bodies of the signal lines extending in a first direction A1; and first connection lines 24, each being configured to cascade two drive circuit pad groups 21 adjacent in the first direction A1, where orthographic projections of the first connection lines 24 on the base substrate 1 not overlapping with orthographic projections of the signal lines 23 on the base substrate 1.

In embodiments of the disclosure, an orthographic projection of the first connection line 24 cascading the two adjacent drive circuit pad groups 21 on the base substrate 1 does not overlap with an orthographic projection of the signal line 23 on the base substrate 1, thereby avoiding the risk of a short circuit generated when the first connection line 24 overlaps the signal line 23.

It should be noted that FIGS. 1A and 2A only show two columns of control areas 2 in order to clearly illustrate an arrangement mode of the drive circuit pad groups 21, the functional element pad groups 22, the signal lines 23, and the first connection lines 24 In embodiments of the disclosure. During specific implementation, the wiring substrate may be provided with a larger number of control areas 2, and the embodiment of the disclosure is not limited thereto.

In one possible implementation, with reference to FIGS. 1A, 1B, 1C, 1D, 2A, 2B, 2C and 2D, the signal lines 23 includes a ground signal line 231 and a power supply signal line 232, the ground signal line 231 and the power supply signal line 232 being located at two sides of the drive circuit pad group 21 respectively. Specifically, for example, as shown in FIG. 1A or FIG. 2A, the ground signal line 231 is located on a left side of the drive circuit pad group 21, and the power supply signal line 232 is located on a right side of the drive circuit pad groups 21; and the drive circuit pad group 21 includes a ground pad GND and a power supply pad PWR. In combination with FIG. 1D or FIG. 2D, the ground pad GND is located on a side of the power supply pad PWR close to the ground signal line 231, the ground pad GND is electrically connected with the ground signal line 231, and the power supply pad PWR is electrically connected with the power supply signal line 232. In embodiments of the disclosure, the ground pad GND is located at a side of the power supply pad PWR close to the ground signal line 231, and the power supply pad PWR is located at a side of the ground pad GND close to the power supply signal line 232. In the drive circuit pad group 21, the ground pad GND and the ground signal line 231 are arranged nearby, and the power supply pad PWR and the power supply signal line 232 are arranged nearby, such that whole wiring is concise, circuitous wiring is avoided, the ground signal line 231 may be electrically connected with the ground pad GND without bypassing other structures or wires, the power supply signal line 232 may be electrically connected with the power supply pad PWR without bypassing other structures or wires, and moreover, the situation that when the first connection line 24 intersects with the signal line when bypassing other structures or wires, a short circuit tends to occur may be avoided. In one possible implementation, in combination with FIGS. 1A, 1B, 1C, 1D, 2A, 2B, 2C and 2D, the wiring substrate has a binding area Y, including a plurality of binding terminals for being electrically connected with an external control circuit, such as a flexible circuit board, a printed circuit board, a programmable logic array, etc., and respective signal lines on the wiring substrate are electrically connected with the binding terminals, so as to receive an electrical signal input by an external control circuit. Each of the drive circuit pad groups 21 further includes: an input pad DI and an output pad OUT. Specifically, in combination with FIGS. 1A, 1D, 1E, 2A, 2D and 2E, in each of the control areas 2, the output pad OUT of the drive circuit pad group 21 is electrically connected with the functional element pad group 22 and is electrically connected with the input pad DI of the next stage of drive circuit pad group 21, and the input pad DI of the drive circuit pad group 21 is electrically connected with the output pad OUT of the previous stage of drive circuit pad group 21. The output pad OUT is located at a position in the drive circuit pad group 21 close to the functional element pad group 22. For example, the input pad DI, the output pad OUT, the ground pad GND, and the power supply pad PWR in each of the drive circuit pad groups 21 are distributed in two rows and two columns, and the output pad OUT is located in a row far away from the binding area Y The functional element pad group 22 is usually located on a side of the drive circuit pad group 21 away from the binding area Y In embodiments of the disclosure, the output pad OUT is located on a row of the two-row-two-column array of the drive circuit pad group 21 away from the binding area Y, such that the drive circuit pad group 21 may be conveniently connected with the functional element pad group 22 nearby, and the drive circuit pad groups 21 avoid circuitous wiring when connected with the functional element pad groups 22.

In one possible implementation, in combination with FIGS. 1B and 1C, arrangement modes of the input pad DI, the output pad OUT, the ground pad GND and the power supply pad PWR are different in the drive circuit pad groups 21 of the two control areas 2 that are adjacent in the second direction A2. Specifically, for example, as shown in FIG. 1B, in the drive circuit pad group 21 of the first control area 210, the output pad OUT is located at an upper left of the two-row-two-column array, the power supply pad PWR is located at an upper right of the two-row-two-column array, and the ground pad GND is located at a lower left of the two-row-two-column array. For example, as shown in FIG. 1C, in each drive circuit pad group 21 of the second control area 220, the output pad OUT is located at the upper left of the two-row-two-column array, the input pad DI is located at the upper right of the two-row-two-column array, the ground pads GND is located at the lower left of the two-row-two-column array, and the power supply pads PWR is located at the lower right of the two-row-two-column array. In embodiments of the disclosure, under the conditions that the ground pad GND and the ground signal line 231 are arranged nearby and the power supply pad PWR and the power supply signal line 232 are arranged nearby, arrangement modes of the input pad DI, the output pad OUT, the ground pad GND and the power supply pad PWR in the drive circuit pad groups 21 in two adjacent control areas 2 are different, as such, when the pads of different control areas 2 are connected with the corresponding signal lines, concise wirings may be provided, and numerous circuitous wirings are avoided.

In one possible implementation, with reference to FIGS. 1A, 1B, 1C, 1D, 2A, 2B, 2C, 2D, 3A and 3B, the plurality of control areas 2 include a first control area 210 and a second control area 220 that are adjacent in the second direction A2, where the plurality of drive circuit pad groups 21 in the first control area 210 are sequentially in cascade connection in the first direction A1 from a side close to the binding area Y; the plurality of drive circuit pad groups 21 in the second control area 220 are sequentially in cascade connection in the first direction A1 from a side away from the binding area Y; and the drive circuit pad group 21 in the first control area 210 farthest away from the binding area Y is connected in cascade with the drive circuit pad group 21 in the second control area 220 farthest away from the binding area Y Specifically, for example, with FIG. 1A as an example, the plurality of drive circuit pad groups 21 in the first control area 210 at a left side are sequentially in cascade connection upwards in the first direction A1 from the side close to the binding area Y, the plurality of drive circuit pad groups 21 in the second control area 220 are sequentially in cascade connection downwards in the first direction A1 from the side farthest away from the binding area Y, and the uppermost drive circuit pad group 21 in the first control area 210 is connected in cascade with the uppermost drive circuit pad group 21 in the second control area 220 to form an addressing signal loop. In the drive circuit pad group 21 in the first control area 210, the output pad OUT and the input pad DI are located in different rows; and in the drive circuit pad group 210 in the second control area 220, the output pad OUT and the input pad DI are located in the same row. Thus, for the wiring substrate in which every two columns of control areas 2 are in cascade connection to form one addressing signal loop, a position relation of the pads is designed for the drive circuit pad groups 210 of different control areas 2, so that when the pads are connected with corresponding signal lines, the wiring substrate has a concise wiring layout and avoids numerous circuitous layout.

Specifically, as shown in FIGS. 1A and 2A, the plurality of drive circuit pad groups 21 in one control area 2 are connected with the same ground signal line 231, the plurality of drive circuit pad groups 21 in one control area 2 are connected with the same power supply signal line 232, that is, the ground pads GND in the same column of drive circuit pad groups 21 are electrically connected with the same ground signal line 231, and the power supply pads PWR in the same column of drive circuit pad groups 21 are electrically connected with the same power supply signal line 232, such that the ground signal line and the power supply signal line are arranged at the two sides of each of the drive circuit pad groups 21 respectively in order to ensure that the ground signal line and the power supply signal line have sufficient wiring space.

Specifically, in combination with FIGS. 1A and 2A, relative position relations of the plurality of signal lines 23 may be the same in each of the control areas 2, that is, an arrangement mode of the signal lines 23 in one control area 2 may be repeated. Moreover, for all the signal lines 23, an IR drop may cause a deviation in magnitude of signals received by devices (e.g., which may include a drive circuit and a light-emitting element) at different positions connected with the same signal line 23, and therefore, the ground signal lines 231 needs to satisfy the requirement of low impedance. In actual layout, line width and line thicknesses of the ground signal line 231 may be designed to be as large as possible, and a low-resistivity material (such as copper or copper alloy) is used as the ground signal line, to achieve a low-resistance effect. In one possible implementation, with reference to FIGS. 1A, 1B, 1C and 1D, in the drive circuit pad group 21 in the first control area 210, the output pad OUT and the power supply pad PWR are located in the same row, and the output pad OUT and the ground pad GND are located in the same column; and in the drive circuit pad group 21 in the second control area 220, the output pad OUT and the input pad DI are located in the same row, and the output pad OUT and the ground pad GND are located in the same column. Specifically, as shown in FIG. 1B, in the drive circuit pad group 21 in the first control area 210, the output pad OUT is located at the upper left of the two-row-two-column array of each of the drive circuit pad groups, the power supply pad PWR is located at the upper right of the two-row-two-column array of each of the drive circuit pad groups, the ground pad GND is located at the lower left of the two-row-two-column array of each of the drive circuit pad groups, and the input pad DI is located the lower right of the two-row-two-column array of each of the drive circuit pad groups. Thus, in the drive circuit pad group 21 in the first control area 210, the ground pad GND is near to and connected with the ground signal line 231 located at the left side of the ground pad GND, the power supply pad PWR is near to and connected with the power supply signal line 232 located at the right side of the power supply pad PWR, the input pad DI is near to and connected with the output pad OUT of the previous stage of drive circuit pad group 21 (i.e., the drive circuit pad group 21 below the current drive circuit pad group 21), and the output pad OUT is near to and connected with the input pad DI of the next stage of drive circuit pad group 21 (i.e., the drive circuit pad group 21 above the current drive circuit pad group 21), such that a concise wiring mode is achieved. The problem that orthographic projections of the first connection lines 24 overlapping with that of the ground signal lines GND on the base substrate 1, and the problem that orthographic projection of the first connection line overlapping with that of other connection lines (for example, power supply connection lines for connecting the power supply pads and the power supply signal lines if the power supply pads are located at the upper left, the ground pads are located at the lower right, the input pads are located at the lower left and the output pads are located at the upper right) on the base substrate 1 due to the necessary of bypassing other connection lines (for example, ground connection lines for connecting the ground pads and the ground signal lines if the power supply pads are located at the upper left, the ground pads are located at the lower right, the input pads are located at the lower left, and the output pads are located at the upper right) are avoided. In the drive circuit pad group 21 in the second control area 220, the output pad OUT is located at the upper left of the two-row-two-column array of each of the drive circuit pad groups, the input pad DI is located at the upper right of the two-row-two-column array of each of the drive circuit pad groups, the ground pad GND is located at the lower left of the two-row-two-column array of each of the drive circuit pad groups, the power supply pad PWR is located at the lower right of the two-row-two-column array of each of the drive circuit pad groups, and therefore, in the drive circuit pad groups 21 in the second control area 220, the ground pad GND is near to and connected with the ground signal line 231 located at the left side of the ground pad GND, the power supply pad PWR is near to and connected with the power supply signal line 232 located at the right side of the power supply pad PWR, the input pad DI is near to and connected with the output pad OUT of the previous stage of drive circuit pad group 21 (that is, the drive circuit pad group 21 above the current drive circuit pad group 21), the output pad OUT is near to and connected with the input pad DI of the next stage of drive circuit pad group 21 (that is, the drive circuit pad group 21 below the current drive circuit pad group 21), such that a concise wiring mode is achieved. The problem that orthographic projections of the first connection lines 24 overlapping with that of the ground signal lines GND on the base substrate 1, and the problem that orthographic projection of the first connection line overlapping with that of other connection lines (for example, power supply connection lines for connecting the power supply pads and the power supply signal lines if the power supply pads are located at the upper left, the ground pads are located at the lower right, the input pads are located at the lower left and the output pads are located at the upper right) on the base substrate 1 due to the necessary of bypassing other connection lines (for example, ground connection lines for connecting the ground pads and the ground signal lines, and connection lines for connecting the current input pads with the output pads of the next stage of drive circuit pad group, if the power supply pads are located at the upper left, the ground pads are located at the lower right, the input pads are located at the lower left, and the output pads are located at the upper right) are avoided.

In one possible implementation, with reference to FIGS. 2B, 2C and 2D, the output pad OUT and the ground pad GND in the first control area 210 are located in the same row, and the output pad OUT and the power supply pad PWR are located the same column; and in the drive circuit pad group 21 of the second control area 220, the output pad OUT and the ground pad GND are located in the same row, and the output pad OUT and the ground pad GND are located in the same column. Specifically, as shown in FIG. 2B, in the drive circuit pad group 21 in the first control area 210, the ground pad GND is located at the upper left of the two-row-two-column array of each of the drive circuit pad groups, the output pad OUT is located at the upper right of the two-row-two-column array of each of the drive circuit pad groups, the input pad DI is located at the lower left of the two-row-two-column array of each of the drive circuit pad groups, and the power supply pad PWR is located at the lower right of the two-row-two-column array of each of the drive circuit pad groups. Thus, in the drive circuit pad group 21 in the first control area 210, the ground pad GND is near to and connected with the ground signal line 231 located at the left side of the ground pad, the power supply pad PWR is near to and connected with the power supply signal line 232 located at the right side of the power supply pad, the input pad DI is near to and connected with the output pad OUT of the previous stage of drive circuit pad group 21 (i.e., the drive circuit pad group 21 below the current drive circuit pad group 21), and the output pad OUT is near to and connected with the input pad DI of the next stage of drive circuit pad group 21 (i.e., the drive circuit pad group 21 above the current drive circuit pad group 21), such that a concise wiring mode is achieved. The problem that orthographic projections of the first connection lines 24 overlapping with that of the ground signal lines GND on the base substrate 1, and the problem that orthographic projection of the first connection line overlapping with that of other connection lines (for example, power supply connection lines for connecting the power supply pads and the power supply signal lines if the power supply pads are located at the upper left, the ground pads are located at the lower right, the input pads are located at the lower left and the output pads are located at the upper right) on the base substrate 1 due to the necessary of bypassing other connection lines (for example, ground connection lines for connecting the ground pads and the ground signal lines if the power supply pads are located at the upper left, the ground pads are located at the lower right, the input pads are located at the lower left, and the output pads are located at the upper right) are avoided.

In the drive circuit pad group 21 in the second control area 220, the output pads OUT is located at the upper left of the two-row-two-column array of each of the drive circuit pad groups, the input pad DI is located at the upper right of the two-row-two-column array of each of the drive circuit pad groups, the ground pad GND is located at the lower left of the two-row-two-column array of each of the drive circuit pad groups, the power supply pad PWR is located at the lower right of the two-row-two-column array of each of the drive circuit pad groups. Thus, in the drive circuit pad group 21 in the second control area 220, the ground pad GND is near to and connected with the ground signal line 231 located at the left side of the ground pad GND, the power supply pad PWR is near to and connected with the power supply signal line 232 located at the right side of the power supply pad PWR, the input pad DI is near to and connected with the output pad OUT of the previous stage of drive circuit pad group 21 (i.e., the drive circuit pad group 21 above the current drive circuit pad group 21), the output pad OUT is near to and connected with the input pad DI of the next stage of drive circuit pad group 21 (i.e., the drive circuit pad group 21 below the current drive circuit pad group 21), such that a concise wiring mode is achieved. The problem that orthographic projections of the first connection lines 24 overlapping with that of the ground signal lines GND on the base substrate 1, and the problem that orthographic projection of the first connection line overlapping with that of other connection lines (for example, power supply connection lines for connecting the power supply pads and the power supply signal lines if the power supply pads are located at the upper left, the ground pads are located at the lower right, the input pads are located at the lower left and the output pads are located at the upper right) on the base substrate 1 due to the necessary of bypassing other connection lines (for example, ground connection lines for connecting the ground pads and the ground signal lines, and connection lines for connecting the current input pads with the output pads of the next stage of drive circuit pad group, if the power supply pads are located at the upper left, the ground pads are located at the lower right, the input pads are located at the lower left, and the output pads are located at the upper right) are avoided.

In one possible implementation, with reference with FIGS. 3B and 3C, in at least one of control areas 2, for example, in the drive circuit pad group 21 in the second control area 220, the first connection line 24 includes: a first connection sub-segment 241 and a second connection sub-segment 242. An orthographic projection of the first connection sub-segment 241 on the base substrate 1 overlaps with an orthographic projection of the drive circuit pad group 21 on the base substrate 1, one end of the first connection sub-segment 241 is electrically connected with the output pad OUT, and the other end of the first connection sub-segment is electrically connected with the second connection sub-segment 242; and the other end of the second connection sub-segment 242 is electrically connected with the input pad DI of the next stage of drive circuit pad group 21. Specifically, taking FIG. 3C as an example, the main body of the first connection sub-segment 241 extends in the first direction A1, one end of the first connection sub-segment 241 in the extension direction in the first direction A1 is electrically connected with the output pad OUT, and the other end of the first connection sub-segment is electrically connected with the second connection sub-segment 242; and the other end of the second connection sub-segment 242 is electrically connected with the input pad DI of the next stage of drive circuit pad group 21. In embodiments of the disclosure, for a cascade connection mode of the second control area 220 from the side away from the binding area Y to the side close to the binding area Y, the output pad OUT needs to be connected with the functional element pad group 22 towards the side away from the binding area Y, and needs to be connected with the input pad DI of the next stage of drive circuit pad group 21 towards the side close to the binding area Y, and each of the first connection line 24 includes the first connection sub-segment 241 located in the drive circuit pad group 21 such that the first connection line 24 may have a short wiring path to avoid intersection with other connection lines (e.g., as shown in FIG. 1A, the ground connection line 251 for connecting the ground pad GND and the ground signal line 231, or the power supply connection line 252 for connecting the power supply pad PWR and the power supply signal line 232).

In one possible implementation, in combination with FIG. 3C, the main body of the first connection sub-segment 241 extend in the first direction A1, and the orthographic projection of the first connection sub-segment 241 on the base substrate 1 is located at the gap between the orthographic projections of the ground pad GND on the base substrate 1 and the orthographic projection of the power supply pad PWR on the base substrate 1.

In one possible implementation, in combination with FIG. 3C, a width $h_1$ of the first connection sub-segment 241 in the second direction A2 is $\frac{1}{5}$ to $\frac{1}{2}$ of a minimum spacing $h_2$ between the ground pad GND and the power supply pad PWR, thereby ensuring an excellent connection effect, and avoiding contact with the ground pad GND and/or the power supply pad PWR. Specifically, in the drive circuit pad group 21, a spacing between the respective pads in the second direction A2 is greater than or equal to 100 μm, and a spacing between the respective pads in the first direction A1 is greater than or equal to 50 μm. The width h1 of the first connection sub-segment 241 in the second direction A2 depends on the spacing between the pads in the second direction A2. Taking the spacing between the pads in the second direction A2 being 100 m as an example, a wiring width may be 50 μm.

In one possible implementation, in combination with FIGS. 1B and 1C, a minimum spacing $h_2$ between the ground pad GND and the power supply pad PWR in the second control area 220 is greater than a minimum spacing $h_3$ between the ground pad GND and the power supply pad PWR in the first control area 210. Thus, in the second control area 220, wiring of the first connection sub-segment 241 between the ground pad GND and the power supply pad PWR is facilitated.

In one possible implementation, in combination with FIG. 1A or 2A, the wiring substrate includes: a second connection line 26, where the drive circuit pad group 210 in the first control area 210 farthest away from the binding area Y is connected in cascade with the drive circuit pad group 210 in the second control area 220 farthest away from the binding area Y via the second connection line 26.

Figure 4:
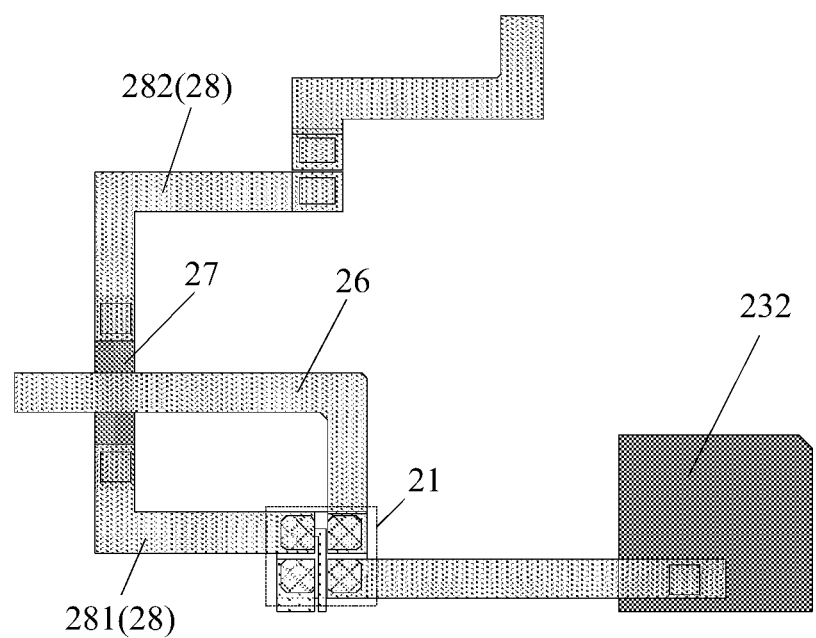
FIG. 4 is an enlarged view of the structure shown in a dashed box X8 in FIG. 1A.

In one possible implementation, with reference to FIGS. 1A, 2A and 4, in which FIG. 4 is an enlarged view of the structure shown in a dashed box X8 in FIG. 1A, the second control area 220 includes a first drive circuit pad group 211 farthest from the binding area Y and a first functional element pad group 221 farthest from the binding area Y, where the second connection line 26 extends in the second direction A2 and is located in a gap between the first drive circuit pad group 211 and the first functional element pad group 221. With reference to FIG. 1A or 4, the second control area 220 further includes a bridging portion 27 in a different layer from the second connection line 26 and an output connection line 28 electrically connected with the drive circuit pad group 21 and the first functional element pad group 22. The output connection line 28 includes a first output connection sub-line 281 and a second output connection sub-line 282 that are located in the same layer as the second connection line 26 and extend in the first direction A1, where one end of the first output connection sub-line 281 is electrically connected with the output pad OUT of the drive circuit pad group 21, one end of the second output sub-connection line 282 is electrically connected with the functional element pad group 22, and the other end of the first output sub-connection line 281 is electrically connected with the other end of the second output connection sub-line 282 via the bridging portion 27. That is, at an intersection in which the second connection line 26 is connected with the output connection line 28, the output connection line 28 is disconnected, and then bridged and connected via the bridging portion 27. In embodiments of the disclosure, the second connection line 26 is located in a gap between the drive circuit pad group 21 and the functional element pad group 22, such that a short wiring path may be provided, and avoids numerous circuitous wirings. In addition, the bridging portion 27 may connect the output connection line 28 at the intersection position in which the second connection line 26 is connected with the output connection line 28.

Figure 5:
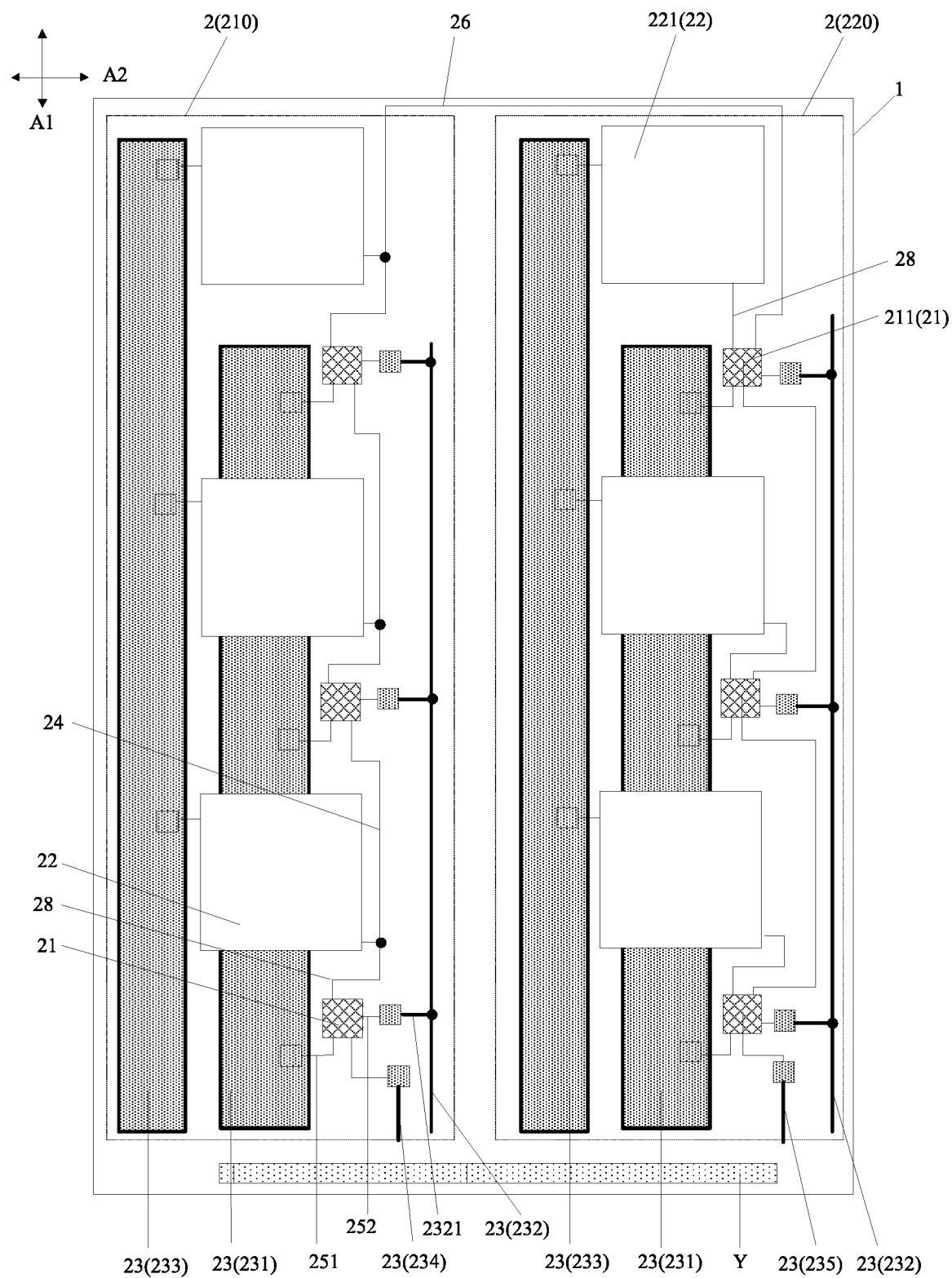
FIG. 5 is a third schematic top view of a wiring substrate provided in an embodiment of the disclosure.

In one possible implementation, with reference to FIG. 5, the second control area 220 includes a first drive circuit pad group 211 farthest from the binding area Y, and a first functional element pad group 221 farthest from the binding area Y The second connection line 26 extends in the second direction A2 and is located at a side of the first functional element pad group 221 away from the first drive circuit pad group 211. Thus, when the first control area 210 is connected in cascade with the second control area 220, the situation that when the second connection line 26 is intersected with other connection lines (e.g., the output connection line 28 for connecting the first functional element pad group 22 and the first drive circuit pad 21), other connection lines (e.g., the output connection line 28 for connecting the functional element pad group 22 and the drive circuit pad group 21 as shown in FIG. 1A) need to be connected in a bridged manner can be avoided.

Figure 6A:
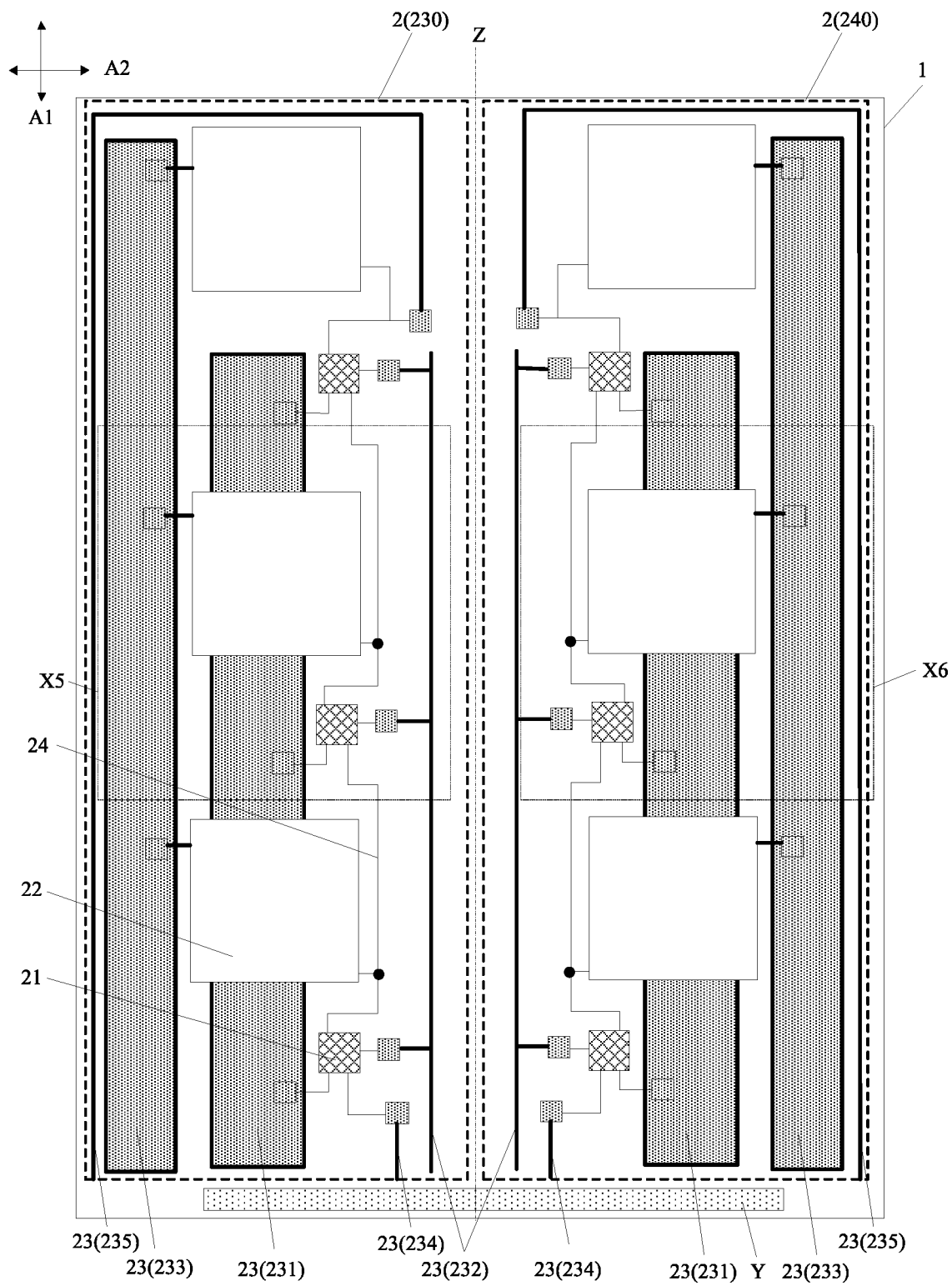
FIG. 6A is a fourth schematic top view of a wiring substrate provided in an embodiment of the disclosure.
Figure 6B:
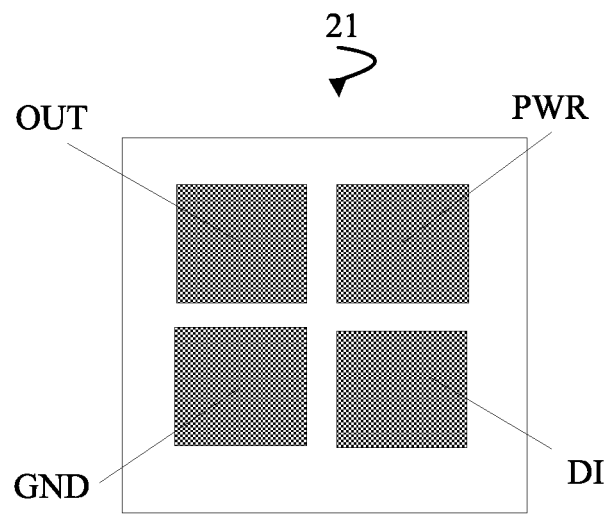
FIG. 6B is an enlarged view of a drive circuit pad group 21 of a control area 2 on a left side in FIG. 6A.
Figure 6C:
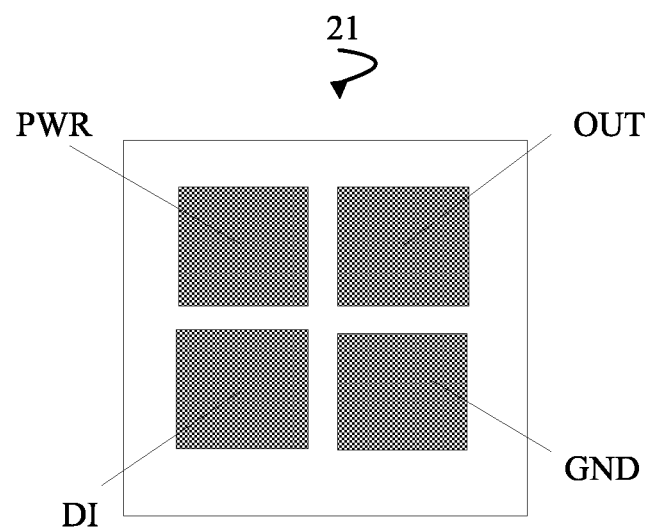
FIG. 6C is an enlarged view of a drive circuit pad group 21 of a control area 2 on a right side in FIG. 6A.
Figure 7A:
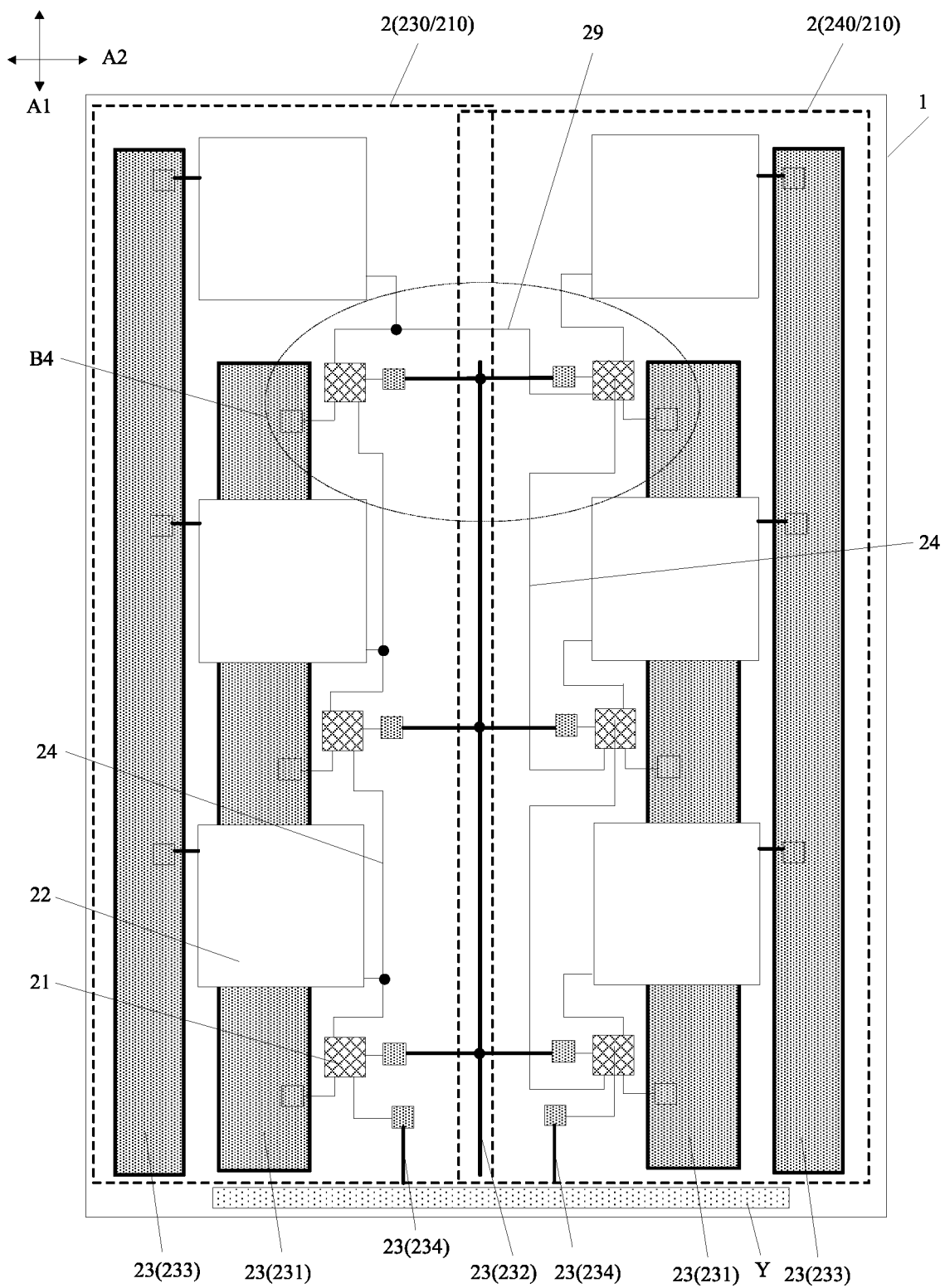
FIG. 7A is a fifth schematic top view of a wiring substrate provided in an embodiment of the disclosure.
Figure 7B:
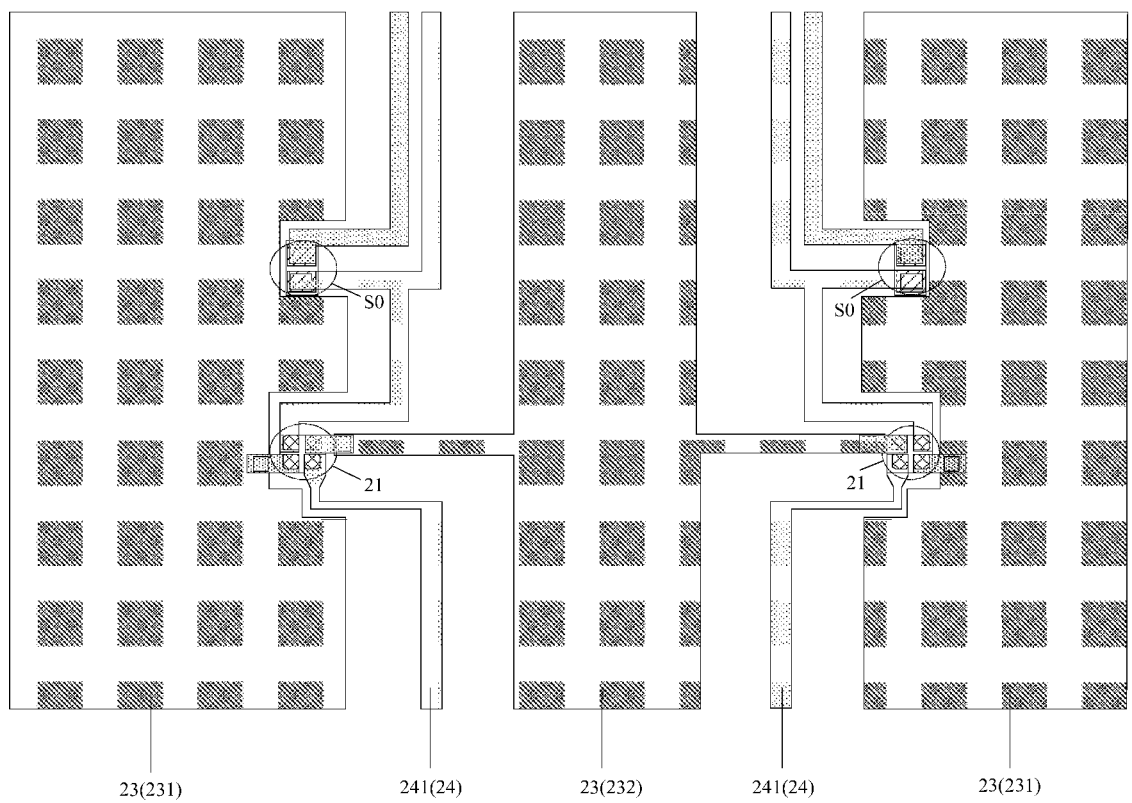
FIG. 7B is an enlarged view of the structure shown in a dashed circle B3 in FIG. 7A.
Figure 7C:
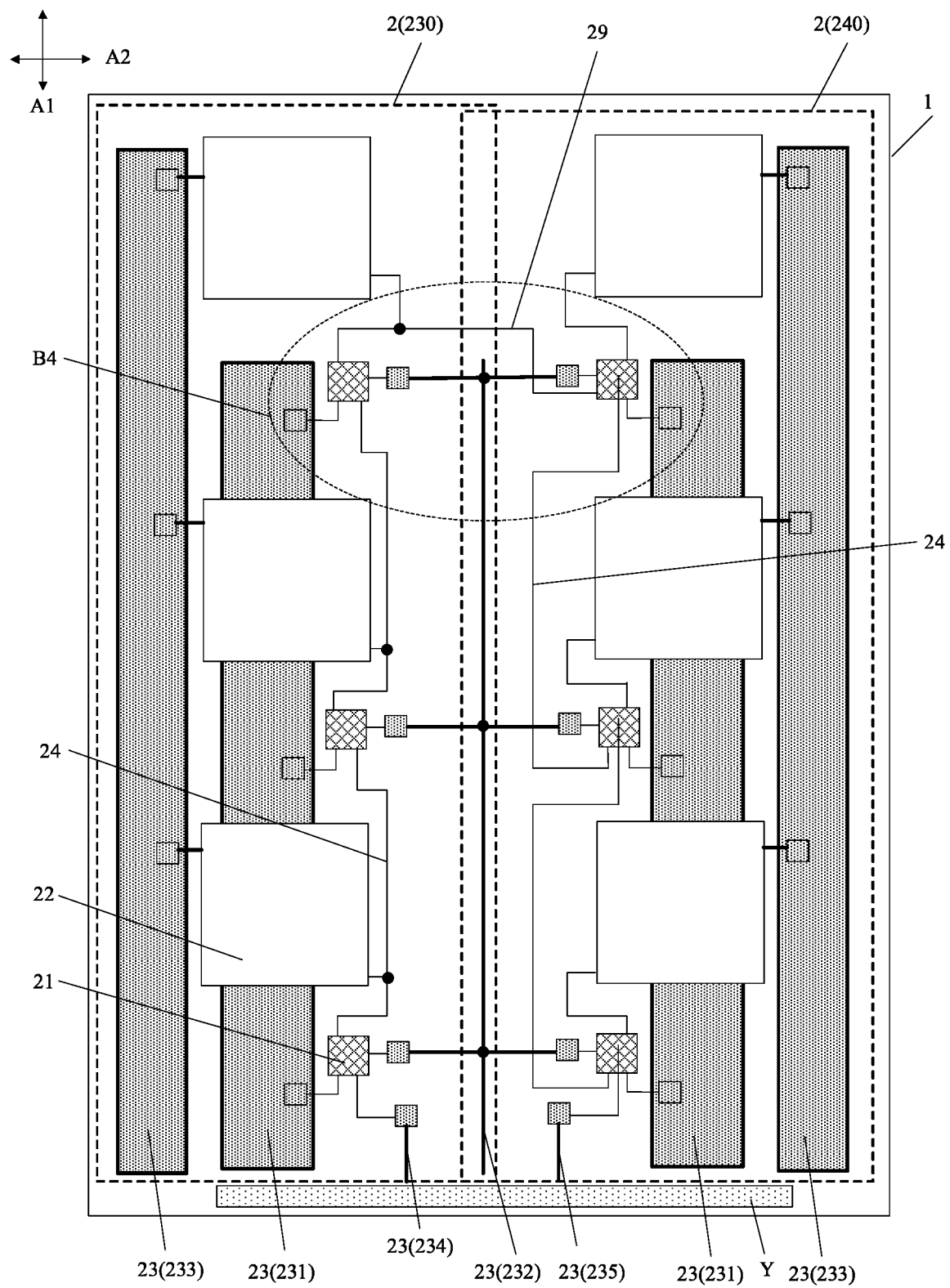
FIG. 7C is a sixth schematic top view of a wiring substrate provided in an embodiment of the disclosure.

In one possible implementation, in combination with FIGS. 7C, 6B and 6C, in which FIG. 6B is a schematic diagram of the drive circuit pad group 21 in the first control area 210 in FIG. 7C, and FIG. 6C is a schematic diagram of the drive circuit pad group 21 in the second control area 220 in FIG. 7C. For the wiring substrate with two adjacent columns of control areas 2 connected in cascade, an arrangement mode of the input pad DI, the output pad OUT, the ground pad GND and the power supply pad PWR in each of the drive circuit pad groups 21 in the first control area 210 and an arrangement mode of the input pad DI, the output pad OUT, the ground pad GND and the power supply pad PWR in each of the drive circuit pad groups 21 in the second control area 220 are in a mirror symmetry manner.

Figure 6D:
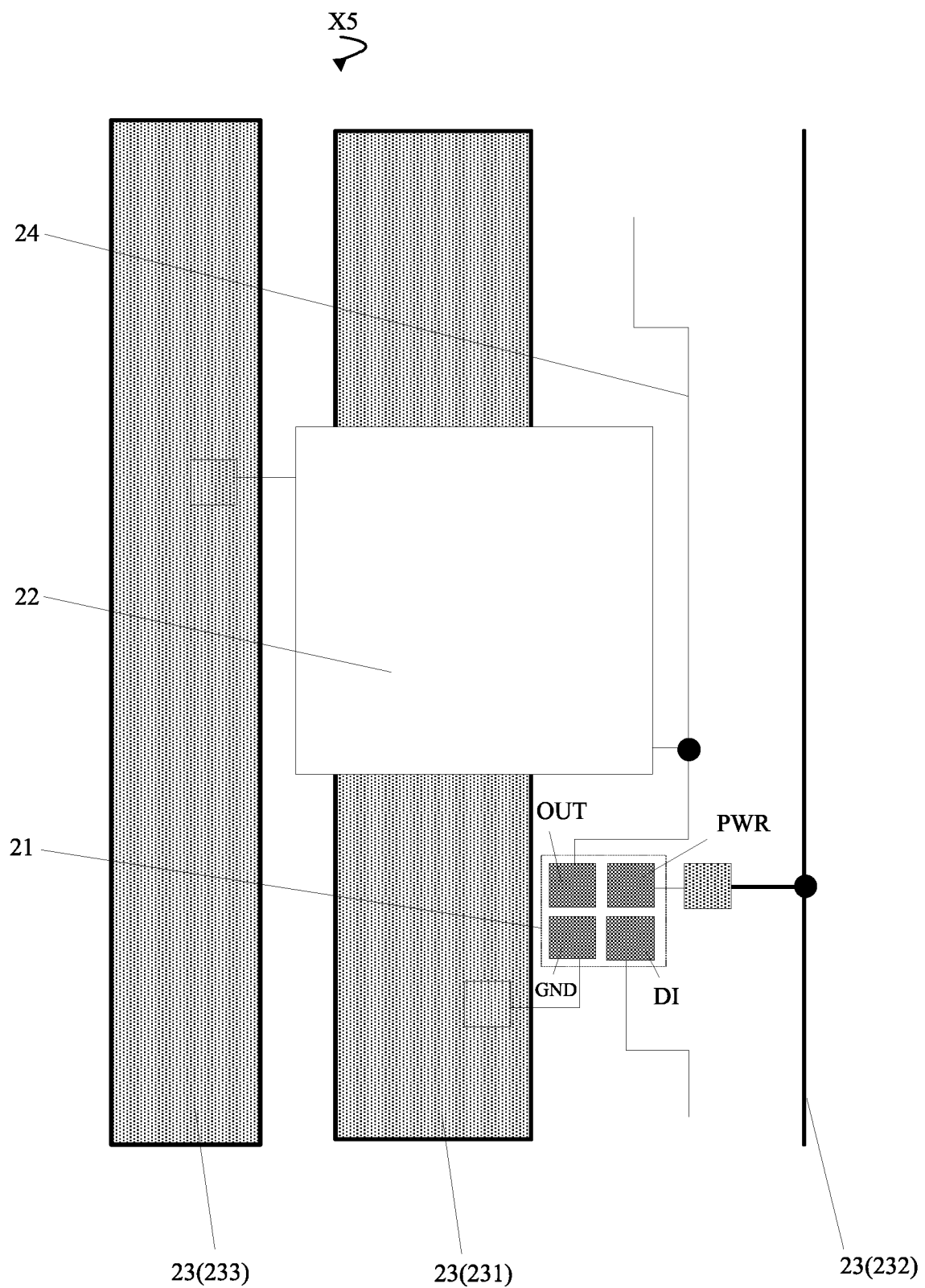
FIG. 6D is an enlarged view of the structure shown in a dashed box X5 in FIG. 6A.
Figure 6E:
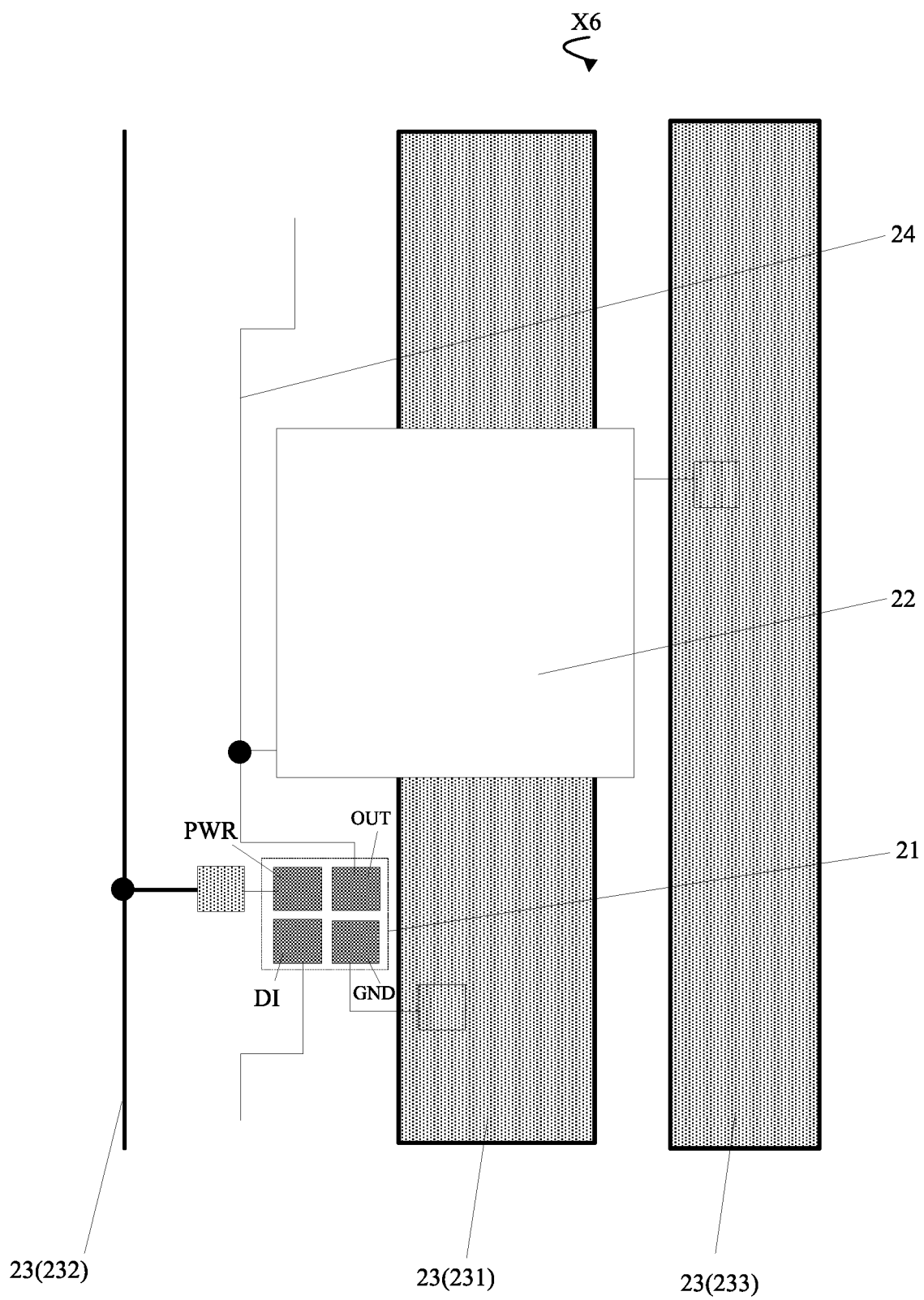
FIG. 6E is an enlarged view of the structure shown in a dashed box X6 in FIG. 6A.

In one possible implementation, with reference to FIGS. 6A, 6B, 6C, 6D, 6E, 7A and 7B, in which FIG. 6B is an enlarged view of the drive circuit pad group 21 of a control area 2 at a left side in FIG. 6A, FIG. 6C is an enlarged view of the drive circuit pad group 21 of a control area 2 at a right side in FIG. 6A, FIG. 6D is an enlarged view of the structure shown in a dashed box X5 in FIG. 6A, FIG. 6E is an enlarged view of the structure shown in a dashed box X6 in FIG. 6A, and FIG. 7B is an enlarged view of the structure shown in a dashed circle B3 in FIG. 7A. The plurality of control areas 2 include a third control area 230 and a fourth control area 240 that are adjacent in the second direction A2, where the plurality of drive circuit pad groups 21 in the third control area 230 are sequentially in cascade connection in the first direction A1 from the side close to the binding area Y, and the plurality of drive circuit pad groups 21 in the fourth control area 240 are sequentially in cascade connection in the first direction A1 from the side close to the binding area Y Specifically, with FIG. 6A or 7A as an example, the plurality of drive circuit pad groups 21 in the third control area 230 are sequentially in cascade connection upwards in the first direction A1 from a lower side close to the binding area Y; the plurality of drive circuit pad groups 21 in the fourth control area 240 are sequentially in cascade connection upwards in the first direction A1 from the lower side close to the binding area Y The power supply signal line 232 connected with the third control area 230 and the power supply signal line 232 connected with the fourth control area 240 are located in the gap between the ground signal line 231 connected with the third control area 230 and the ground signal line 231 connected with the fourth control area 240. In embodiments of the disclosure, the control areas 2 are sequentially in cascade connection in the first direction A1 from one side close to the binding area Y, each of the control areas 2 may be used as an independent addressing loop, and the pads and the corresponding signal lines (or connection lines) are arranged nearby, such that compared with cascade connection of the plurality of control areas 2, each of the control areas serves as an independent addressing loop, the number of drive circuits in cascade connection is small, and signal delay amount of the first stage of drive circuit pad group 21 and the last stage of drive circuit pad group 21 of the same addressing loop may be low while the wiring substrate has the advantages of concise overall wiring, and no risk of circuitous wiring and poor short circuit.

Specifically, for a case in which the power supply signal line 232 connected with the third control area 230 and the power supply signal line 232 connected with the fourth control area 240 are located in the gap between the ground signal line 231 connected with the third control area 230 and the ground signal line 231 connected with the fourth control area 240, in combination with FIGS. 6A and 7A, the plurality of drive circuit pad groups 21 in one control area 2 may be connected with the same ground signal line 231 and the same power supply signal line 232, that is, the ground pads GND in the same column of drive circuit pad groups 21 are connected with the same ground signal line 231, the power supply pads PWR in the same column of drive circuit pad groups 21 are connected with the same power supply signal line 232. In order to ensure that the ground signal line and the power supply signal line have sufficient wiring space, the ground signal line and the power supply signal line are arranged at two sides of each of the drive circuit pad groups 21 respectively. In each of the control areas 2, in order to further optimize the wiring space, the plurality of signal lines 23 in two adjacent control areas 2 may have different relative position relations, for example, may be arranged in a mirror image manner, that is, the signal lines 23 in every two adjacent control areas 2 may be arranged as a repetitive unit.

In one possible implementation, the third control area 230 and the fourth control area 240 may each be provided with one independent power supply signal line 232, which is shown in FIG. 6A; and in one possible implementation, the third control area 230 and the fourth control area 240 may also be connected with the same power supply signal line 232, which is shown in FIG. 7A, thereby further simplifying wiring arrangement of the wiring substrate, and avoiding the risks that many wires are prone to wind, and short circuit occurs when orthographic projections of the many wires overlap on the base substrate 1.

In one possible implementation, with reference to FIGS. 6A, 6B, 6C, 6D, 6E, 7A and 7B, the third control area 230 and the fourth control area 240 are arranged entirely in a mirror symmetry manner. Specifically, the third control area 230 and the fourth control area 240 are symmetrical about a first axis Z parallel to the first direction A1, where a minimum distance between the first axis Z and the ground signal line 231 of the third control area 230 is equal to a minimum distance between the first axis A and the ground signal line 231 of the fourth control area 240, that is, the respective structures of the third control area 230 and the respective structures of the fourth control area 240 are also arranged in a mirror symmetry manner. Specifically, for example, with the wiring substrate shown in FIG. 7A as an example, arrangement positions of the pads in each of the drive circuit pad groups 21 in the third control area 230 and arrangement positions of the pads in each of the drive circuit pad groups 21 in the fourth control area 240 are in a mirror symmetry manner; and the ground signal line 231 in the third control area 230 and the ground signal line 231 in the fourth control area 240 are in a mirror symmetry manner.

In one possible implementation, with reference to FIGS. 6B and 6C, in the drive circuit pad group 21 of the third control area 230, the output pad OUT and the power supply pad PWR are located in the same row, the output pad and the ground pad are located in the same column, that is, the output pad OUT is located at the upper left in the two-row-two-column array of each of the drive circuit pad groups, the power supply pad PWR is located at the upper right in the two-row-two-column array of each of the drive circuit pad groups, the ground pad GND is located at the lower left of the two-row-two-column array of each of the drive circuit pad groups, and the input pad DI is located at the lower right of the two-row-two-column array of each of the drive circuit pad groups. The fourth control area 240 and the third control area 240 are arranged in a mirror symmetry manner, in the drive circuit pad group 21 of the fourth control area 240, the output pad OUT is located at the upper right of the two-row-two-column array of each of the drive circuit pad groups, the power supply pad PWR is located at the upper left of the two-row-two-column array of each of the drive circuit pad groups, the ground pad GND is located at the lower right of the two-row-two-column array of each of the drive circuit pad groups, and the input pad DI is located at the lower left of the two-row-two-column array of each of the drive circuit pad groups.

Figure 7D:
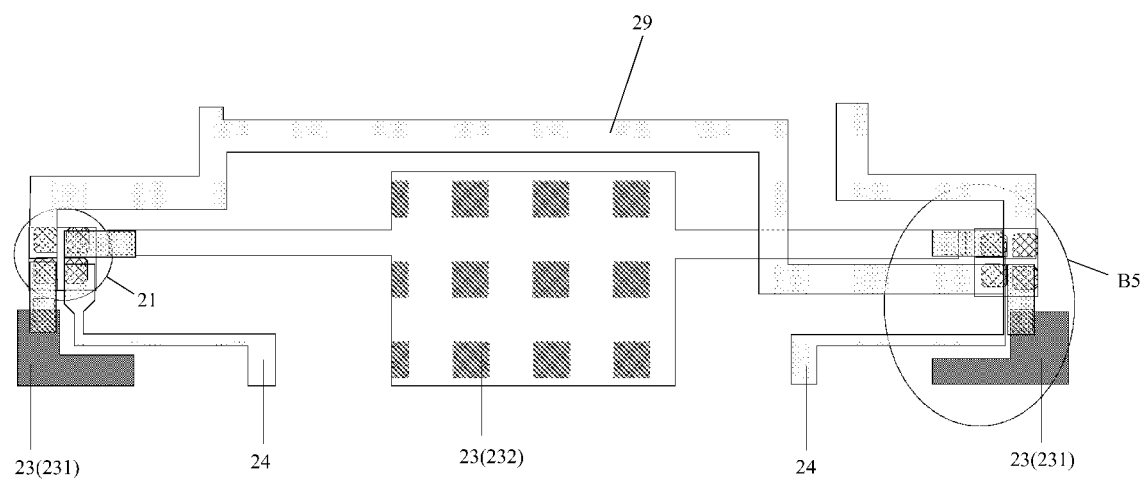
FIG. 7D is an enlarged view of the structure shown in a dashed box B4 in FIG. 7C.
Figure 7E:
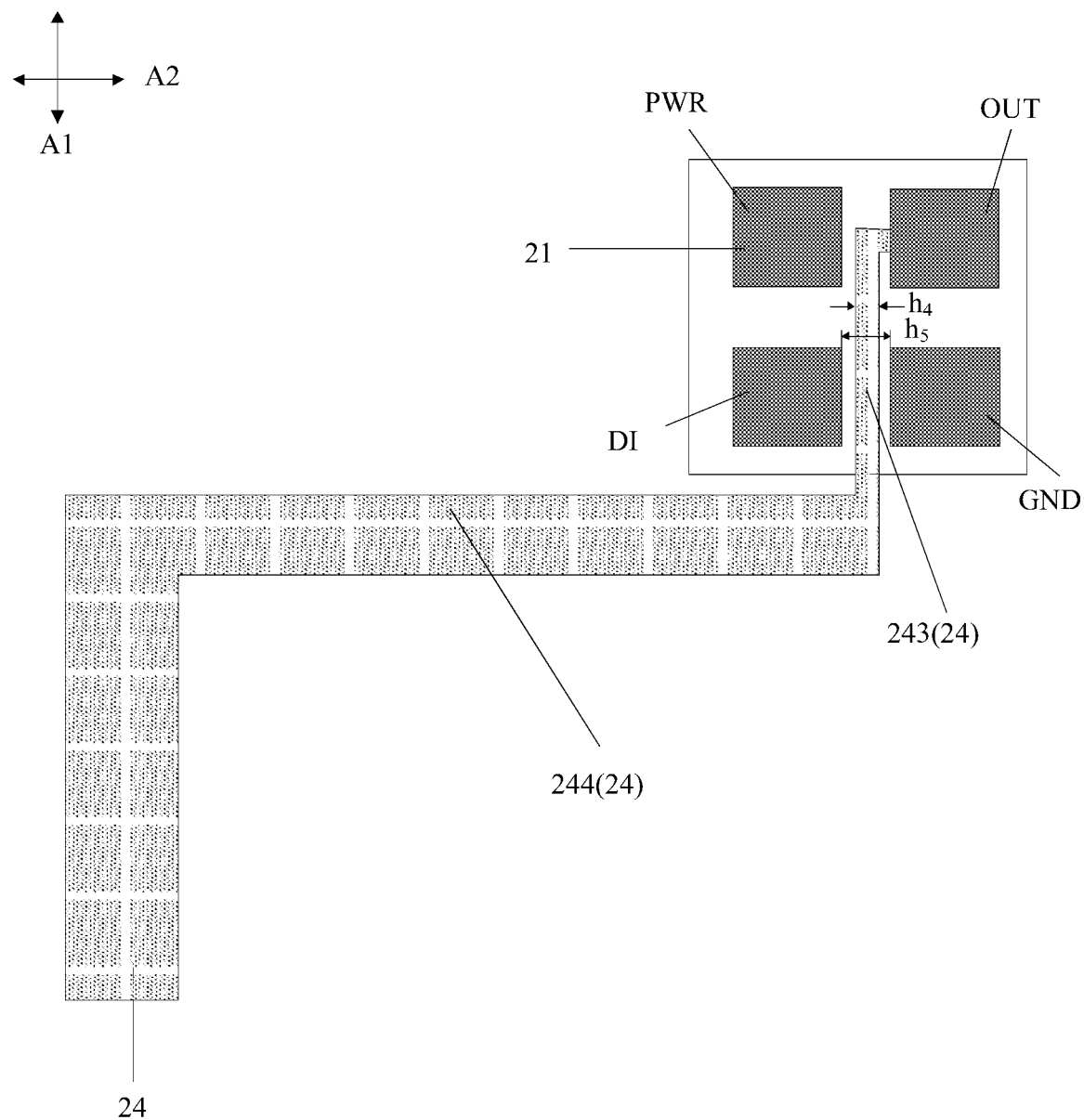
FIG. 7E is an enlarged view of the structure shown in a dashed box B5 in FIG. 7D.

In one possible implementation, for a case in which the power supply signal line 232 connected with the third control area 230 and the power supply signal line 232 connected with the fourth control area 240 are located in the gap between the ground signal line 231 connected with the third control area 230 and the ground signal line 231 connected with the fourth control area 240, in combination with FIGS. 7C, 7D and 7E, in which FIG. 7D is an enlarged view of the structure shown in a dashed box B4 in FIG. 7C, and FIG. 7E is an enlarged view of the structure shown in a dashed box B5 FIG. 7D. The third control area 230 may also be connected in cascade to the fourth control area 240 at the side far away from the binding area Y Specifically, the drive circuit pad group 21 in the third control area 230 farthest away from the binding area Y is connected in cascade with the drive circuit pad group 21 in the fourth control area 240 farthest away from the binding area Y via a third connection line 29. The plurality of drive circuit pad groups 21 in the third control area 230 are sequentially in cascade connection in the first direction A1 from one side close to the binding area Y; and the plurality of drive circuit pad groups 21 in the fourth control area 240 are sequentially in cascade connection in the first direction A1 from one side away from the binding area Y For the fourth control area 240, the output pad OUT of the driving circuit pad group 21 may be electrically connected with the input pad DI of the next stage of drive circuit pad group 21 via the first connection line 24. Specifically, with reference to FIG. 7E, the first connection line 24 includes a third connection sub-segment 243 and a fourth connection sub-segment 244, where an orthographic projection of the third connection sub-segment 243 on the base substrate 1 overlaps an orthographic projection of the drive circuit pad group 21 on the base substrate 1, one end of the third connection sub-segment 243 is electrically connected with the output pad OUT, and the other end of the third connection sub-segment is electrically connected with the fourth connection sub-segment 244; the other end of the fourth connection sub-segment 244 is electrically connected with an input pad DI of the next stage of drive circuit pad group 21. Specifically, the main body of the third connection sub-segment 243 extends in the first direction A1, and an orthographic projection of the third connection sub-segment 243 on the base substrate 1 is located at a gap between an orthographic projection of the input pad DI on the base substrate 1 and an orthographic projection of the ground pad GND on the base substrate 1. Specifically, a width $h_4$ of the third connection sub-segment 243 in the second direction A2 is $1/5$ to $4/5$ of a minimum spacing $h_5$ between the input pad DI and the ground pad GND, thereby ensuring an excellent connection effect, and avoiding contact with the input pad DI and/or the ground pad GND. Specifically, in the drive circuit pad group 21, the spacing between the pads in the second direction A2 are greater than or equal to 100 μm, and the spacing between the pads in the first direction A1 are greater than or equal to 50 μm; and a width $h_4$ of the third connection sub-segment 243 in the second direction A2 depends on the spacing between the pads in the second direction A2, and with the spacing between the pads in the second direction A2 being 100 μm as an example, a wiring width may be 50 μm.

In one possible implementation, in combination with FIG. 1A, the wiring substrate further includes a power line 233 located at the side of the functional element pad group 22 away from the power supply signal line 232, and the functional element pad groups 22 in the same control area 2 are electrically connected with the same power line 233 which supplies power to the functional element pad groups 22.

Specifically, in combination with FIG. 1A, the wiring substrate further includes ground connection lines 251 for connecting the ground pads PWR and the ground signal lines 231, power supply connection lines 252 for connecting the power supply pads PWR and the power supply signal lines 232, output connection lines 28 for connecting the output pads OUT and the functional element pad groups 22, addressing signal lines 234 electrically connected with input pads DI of the first stage of drive circuit pad group 21 of the same addressing loop, addressing connection lines 253 for connecting the input pads DI to the addressing signal lines 234, feedback signal lines 235 electrically connected with the output pads OUT of the last stage of drive circuit pad group 21 of the same addressing loop, and feedback connection lines 254 for connecting the output pads OUT to the feedback signal lines 235.

Specifically, in combination with FIG. 1A, the power supply signal line 232 may include a power supply extension line 2321 extending from the main body extension direction to the drive circuit pad group 21 in the second direction A2.

During specific implementation, the wiring substrate may include a first wiring layer and a second wiring layer on a side of the first wiring layer away from the base substrate 1. The ground signal lines 231, the power supply signal lines 232, the power supply extension lines 2321, the power lines 233, the addressing signal lines 234, the feedback signal lines 235 and the bridging portions 27 may be all located in the same layer, and for example may be all located in the first wiring layer. The first connection lines 24, the second connection lines 26, the ground connection lines 251, the power supply connection lines 252, the addressing connection lines 253, the feedback connection lines 254 and the output connection lines 28 may all be located in the same layer, and for example may all be located in the second wiring layer. The second wiring layer may mainly be for logic connection and signal transmission between different drive circuit pad groups 21.

Specifically, in combination with FIG. 1A, materials of main bodies of the first wiring layer and the second wiring layer may be the same, for example, copper. The wires of different layers may be connected at positions needing to be connected through via holes K. Specifically, for example, the ground signal lines 231 and the ground connection lines 251 located in the first wiring layer are connected via the via holes K, the power supply connection lines 252 and the power supply extension lines 2321 are connected via the via holes K, the addressing connection lines 253 and the addressing signal lines 234 are connected via the via holes K, and the feedback connection lines 254 and the feedback signal lines 235 are connected via the via holes K.

Figure 8:
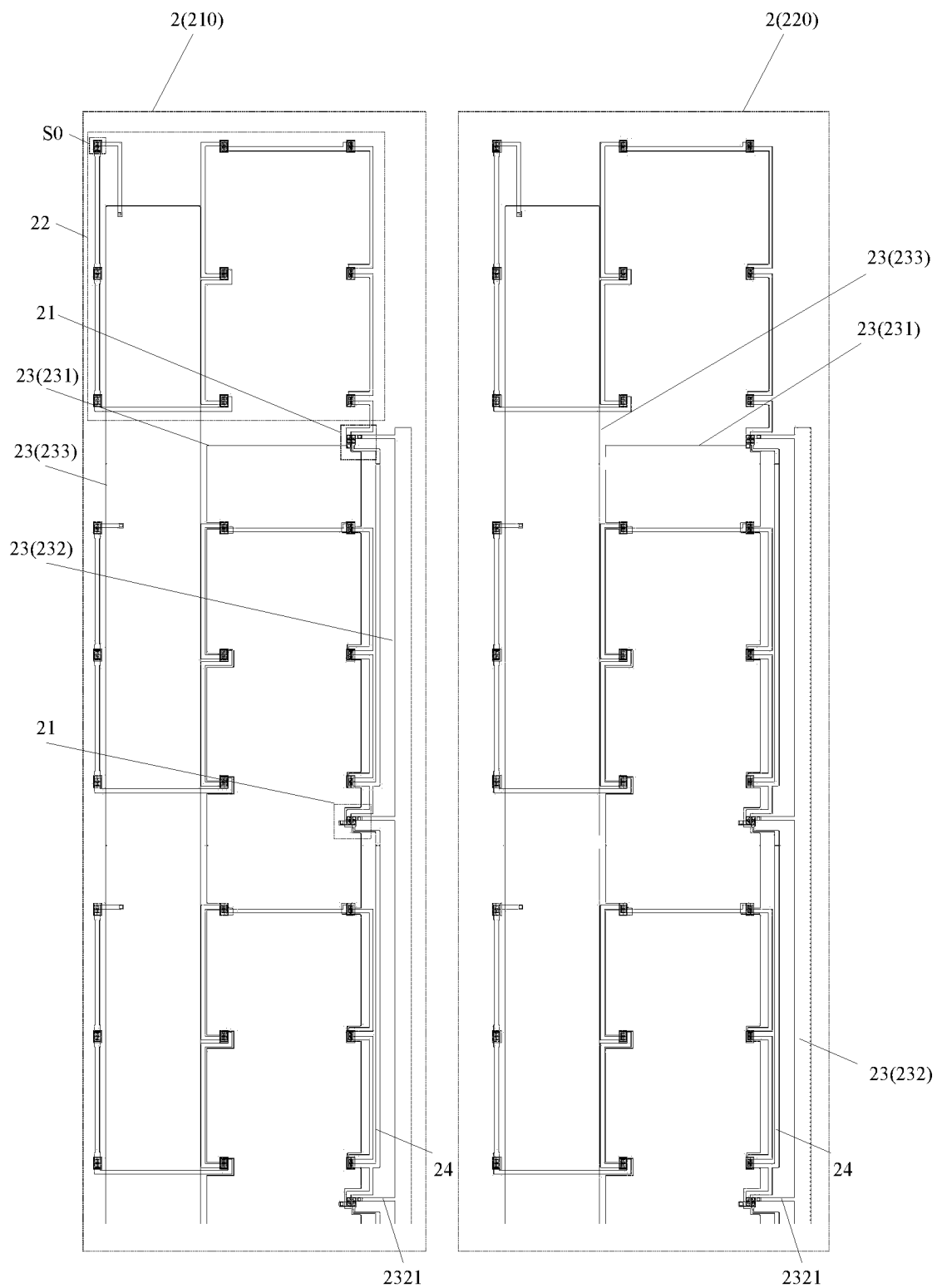
FIG. 8 is a seventh schematic top view of a wiring substrate provided in an embodiment of the disclosure.

In one possible implementation, with reference to FIG. 8, the functional element pad group 22 includes a plurality of pad sub-groups S0 sequentially connected in series, where FIG. 8 is a wiring substrate diagram corresponding to FIG. TA, which illustrates the plurality of pad sub-groups S0 included in each of the functional element pad groups 22. Each of the pad sub-groups S0 may be subsequently bound and connected with one functional element.

On the basis of the same inventive concept, the embodiment of the disclosure further provides a display substrate, including the wiring substrate provided by the embodiment of the disclosure, where each of the functional element pad groups 22 includes a plurality of element pads S0 sequentially connected in series; the display substrate further includes drive circuits in binding connection with the drive circuit pad groups 21. Specifically, the drive circuits may be micro integrated circuit chips, and light-emitting elements in binding connection with each of the pad sub-groups S0, and specifically, the light-emitting elements may be mini light-emitting diodes (MiniLEDs) or micro light-emitting diodes (MicroLEDs).

It may be understood that in FIGS. 1A, 1D, 1E, 2A, 2D, 2E, 5, 6A, 6D, 6E, 7A and 7C, areas in which the functional element pad groups 22 are located are represented by polygonal box structures (quadrilateral boxes in the figures). It should be understood that the functional element pad groups 22 may consist of a plurality of pad sub-groups, and the polygonal boxes are patterns obtained by sequentially connecting the outermost pad sub-groups in each of the functional element pad groups 22 in order to facilitate illustration and understanding of the embodiment of the disclosure. According to the number of pad sub-groups included in the functional element pad groups 22 and relative position relations of the pad sub-groups, the number of sides and/or the shapes of the polygonal boxes are/or changed. The polygonal boxes do not represent areas actually occupied by the functional element pad groups 22 on the wiring substrate. That is, the areas actually occupied by the functional element pad groups 22 on the wiring substrate may be much less than the areas occupied by the polygonal boxes.

Further, it may be seen in FIGS. 3A, 3B, 7B and 8 that when actual layout design is implemented on the wiring substrate, orthographic projections of the plurality of pad sub-groups in the functional element pad groups 22 on the wiring substrate substantially do not overlap with orthographic projections of the signal lines in the first wiring layer on the wiring substrate. For example, main bodies of the ground signal lines 231 in the first wiring layer extend in the first direction, but the ground signal lines 231 may be provided with avoidance structures at positions in which any one of pad sub-groups in the functional element pad groups 22 is located on the wiring substrate, such that a width of portions of the ground signal lines 231 in the second direction is slightly different.

It may be understood that each of the drive circuit pad groups 21 may include other pads besides the input pads DI, the output pads OUT, the ground pads GND, the power supply pads PWR. When the drive circuit pad group 21 includes pads besides the input pads DI, the output pads OUT, the ground pads GND and the power supply pads PWR described above, the four types of pads may be distributed less strictly in an array of the two-row-two-column array in the first direction A1 and the second direction A2. However, positions in which the input pads, the output pads, the ground pads and the power supply pads are located may be sequentially connected with to form a quadrangle, that is, the input pads DI, the output pads OUT, the ground pads GND and the power supply pads PWR are located at four vertexes of a quadrangle respectively, and positions of the input pads, the output pads, the ground pads and the power supply pads are represented by, for example, "upper left", "lower left", "upper right" and "lower right". In embodiments of the disclosure, where it may be deemed that the two pads located at the "upper left" and "lower left" are arranged in the same column, the two pads located at the "upper right" and "lower right" are arranged in the same column, the two pads located at the "upper left" and "upper right" are arranged in the same row, and the two pads located at the "lower left" and "lower right" are arranged in the same row. That is, those skilled in the art would have been able to make adjustments to the specific positions of the input pads DI, the output pads OUT, the ground pads GND, and the power supply pads PWR in each of the drive circuit pad groups 21 in all embodiments of the disclosure without departing from the spirit and scope of the embodiment of the disclosure.

Figure 9:
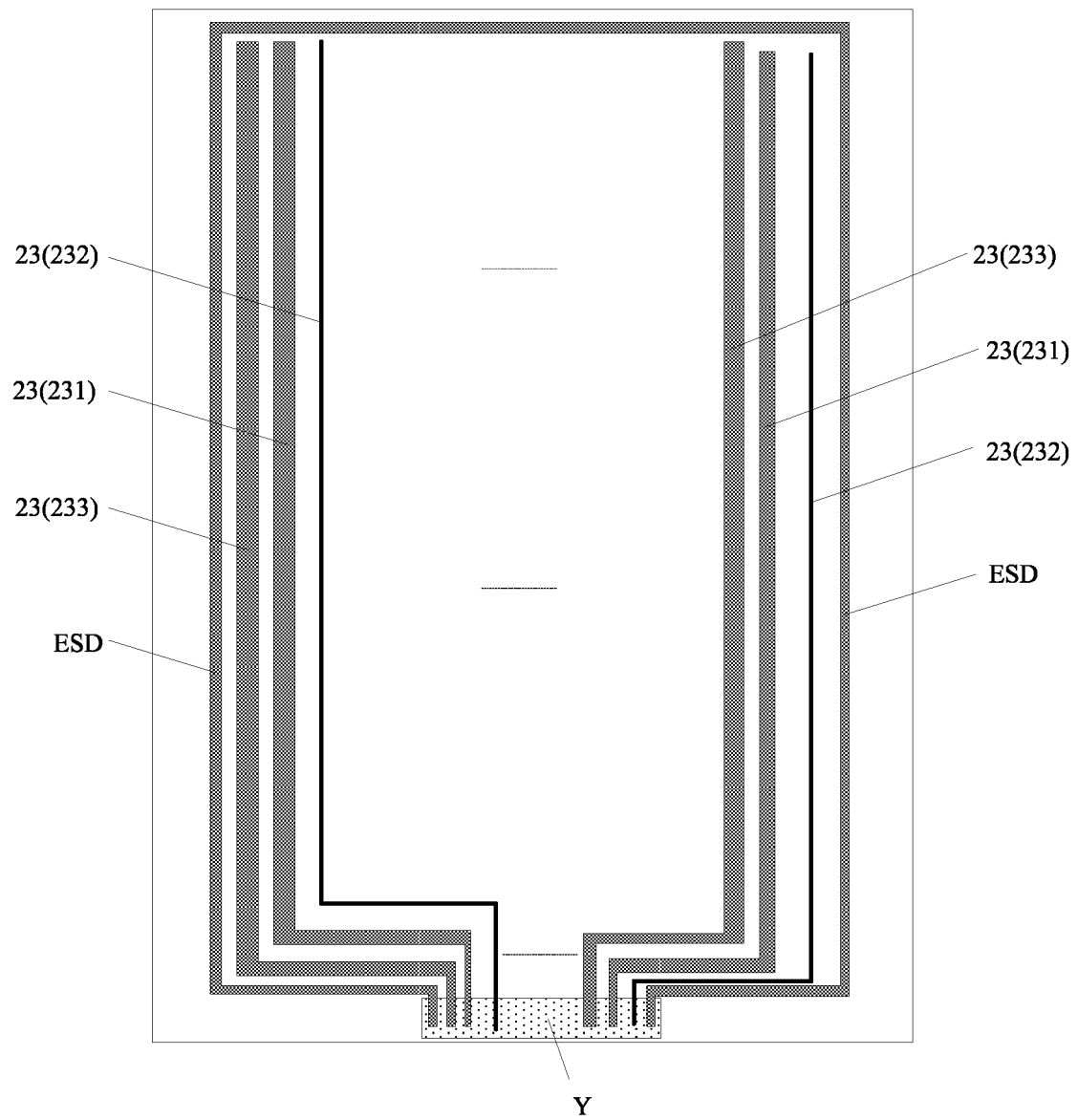
FIG. 9 is an eighth schematic top view of a wiring substrate provided in an embodiment of the disclosure.

During specific implementation, with reference to FIG. 9, the wiring substrate provided by the embodiment of the disclosure further includes anti-static wirings ESD located at peripheries, which are used for performing anti-static protection on the wiring substrate. Specifically, the anti-static wirings ESD are located at the peripheries of functional elements of any signal line, any connection line, any wiring, the functional element pad groups and the drive circuit pad group and form an annular structure. Two ends of the anti-static wiring ESD are connected with binding terminals in the binding area Y Specifically, the anti-static wiring ESD may be located in the first wiring layer.

On the basis of the same inventive concept, the embodiment of the disclosure further provides a display apparatus, including the display substrate provided by the embodiment of the disclosure.

In embodiments of the disclosure, in each of the control areas, the orthographic projection of the first connection line 24 for cascading the two adjacent drive circuit pad groups 21 on the base substrate 1 do not overlap with the orthographic projection of the signal line 23 on the base substrate 1, such that the risk of a short circuit generated when the first connection line 24 overlap with the signal line 23 may be avoided.

Although the preferred embodiments of the disclosure have been described, those skilled in the art may make additional changes and modifications to these embodiments once they learn the basic inventive concept. Therefore, the appended claims are intended to be interpreted as including the preferred embodiments and all changes and modifications falling within the scope of the disclosure.

Apparently, those skilled in the art may make various modifications and variations to the embodiments of the disclosure without departing from the spirit and scope of the embodiments of the disclosure. In this way, if these modifications and variations of the disclosure fall within the scope of the claims of the disclosure and their equivalent technologies, the disclosure is also intended to include these modifications and variations.

What is claimed is:

1. A wiring substrate, comprising:
   a base substrate; and
   a plurality of control areas on a side of the base substrate, each of the plurality of control areas extending in a first direction, the plurality of control areas being sequentially arranged in a second direction, and any one of the plurality of control areas comprising:
   a plurality of drive circuit pad groups sequentially arranged in the first direction;
   a plurality of functional element pad groups, each of which is electrically connected with a corresponding drive circuit pad group;
   a plurality of signal lines, main bodies of which extend in the first direction; and
   first connection lines, each of which is configured to cascade two drive circuit pad groups adjacent in the first direction, wherein
   an orthographic projection of the first connection line on the base substrate not overlapping with an orthographic projection of the signal line on the base substrate.

2. The wiring substrate of claim 1, wherein the signal line comprises a ground signal line and a power supply signal line, the ground signal line and the power supply signal line being located at two sides of the drive circuit pad group respectively; and
   the drive circuit pad group comprises a ground pad and a power supply pad, wherein
   the ground pad is located at a side of the power supply pad close to the ground signal line, the ground pad is electrically connected with the ground signal line, and the power supply pad is electrically connected with the power supply signal line.

3. The wiring substrate of claim 2, further comprising a binding area;
   wherein the drive circuit pad group further comprises an input pad and an output pad, wherein the output pad is located at a position of the drive circuit pad group close to the functional element pad group.

4. The wiring substrate of claim 3, wherein arrangement modes of the input pad, the output pad, the ground pad and the power supply pad are different in the drive circuit pad groups of two adjacent control areas of the plurality of control areas.

5. The wiring substrate of claim 3, wherein the plurality of control areas comprise a first control area and a second control area adjacent in the second direction, wherein
a plurality of drive circuit pad groups in the first control area are sequentially connected in cascade in the first direction from a side close to the binding area, and a plurality of drive circuit pad groups in the second control area are sequentially connected in cascade in the first direction from a side far away from the binding area;
a drive circuit pad group in the first control area farthest away from the binding area is connected in cascade with a drive circuit pad group in the second control area farthest away from the binding area; and
in the drive circuit pad group in the first control area, the output pad and the input pad are located in different rows, and in the drive circuit pad group in the second control area, the output pad and the input pad are located in a same row.

6. The wiring substrate of claim 5, wherein
in the drive circuit pad group in the first control area, the output pad and the power supply pad are located in a same row, and the output pad and the ground pad are located in a same column; and
in the drive circuit pad group in the second control area, the output pad and the input pad are located in a same row, and the output pad and the ground pad are located in a same column; or
in the drive circuit pad group in the first control area, the output pad and the ground pad are located in a same row, and the output pad and the power supply pad are located in a same column; and in the drive circuit pad group in the second control area, the output pad and the input pad are located in a same row, and the output pad and the ground pad are located in a same column.

7. The wiring substrate of claim 6, wherein in at least one of the plurality of control areas, the first connection line comprises a first connection sub-segment and a second connection sub-segment;
wherein an orthographic projection of the first connection sub-segment on the base substrate overlaps with an orthographic projection of the drive circuit pad group on the base substrate, an end of the first connection sub-segment is electrically connected with the output pad, and another end of the first connection sub-segment is electrically connected with the second connection sub-segment; and another end of the second connection sub-segment is electrically connected with an input pad of a next stage of drive circuit pad group.

8. The wiring substrate of claim 7, wherein a main body of the first connection sub-segment extends in the first direction, and an orthographic projection of the first connection sub-segment on the base substrate is located at a gap between an orthographic projection of the ground pad on the base substrate and an orthographic projection of the power supply pad on the base substrate.

9. The wiring substrate of claim 8, wherein a width of the first connection sub-segment in the second direction is $1/5$ to $1/2$ of a minimum spacing between the ground pad and the power supply pad.

10. The wiring substrate of claim 9, wherein a minimum spacing between the ground pad and the power supply pad in the second control area is greater than a minimum spacing between the ground pad and the input pad in the first control area.

11. The wiring substrate of claim 5, further comprising a second connection line;
wherein the drive circuit pad group in the first control area farthest away from the binding area is connected in cascade with the drive circuit pad group in the second control area farthest away from the binding area via the second connection line.

12. The wiring substrate of claim 11, wherein the second control area comprises a first drive circuit pad group farthest from the binding area and a first functional element pad group farthest from the binding area, the second connection line extends in the second direction and is located in a gap between the first drive circuit pad group and the first functional element pad group; and
the second control area further comprises an output connection line electrically connecting the first drive circuit pad group and the first functional element pad group, and a bridging portion in a different layer from the second connection line;
the output connection line comprising a first output connection sub-line and a second output connection sub-line disposed in a same layer as the second connection line and extending in the first direction, wherein an end of the first output connection sub-line is electrically connected with the output pad of the drive circuit pad group, an end of the second output connection sub-line is electrically connected with the functional element pad group, and another end of the first output connection sub-line is electrically connected with another end of the second output connection sub-line via the bridging portion.

13. The wiring substrate of claim 11, wherein the second control area comprises a first drive circuit pad group farthest from the binding area, and a first functional element pad group farthest from the binding area; and the second connection line extends in the second direction and is located at a side of the first functional element pad group far away from the first drive circuit pad group.

14. The wiring substrate of claim 5, wherein an arrangement mode of the input pad, the output pad, the ground pad, and the power supply pad in the drive circuit pad group in the first control area and an arrangement mode of the input pad, the output pad, the ground pad and the power supply pad in the drive circuit pad group in the second control area are in a mirror symmetry manner.

15. The wiring substrate of claim 3, wherein the plurality of control areas comprise a third control area and a fourth control area adjacent in the second direction, wherein a plurality of drive circuit pad groups in the third control area are sequentially connected in cascade in the first direction from the side close to the binding area, a plurality of drive circuit pad groups in the fourth control area are sequentially connected in cascade in the first direction from the side close to the binding area, and
a power supply signal line connected with an elements in the third control area and a power supply signal line connected with an element in the fourth control area are located in a gap between a ground signal line connected with an element in the third control area and a ground signal line connected with an element in the fourth control area.

16. The wiring substrate of claim 15, wherein
the third control area and the fourth control area share a same power supply signal line; and/or
the third control area and the fourth control area are arranged in a mirror symmetry manner.

17. The wiring substrate of claim 16, wherein in the drive circuit pad group of the third control area, the output pad and the power supply pad are located in a same row, and the output pad and the ground pad are located in a same column.

18. The wiring substrate of claim 1, further comprising a power line at a side of the functional element pad group far away from the power supply signal line, wherein the functional element pad groups in a same control area are electrically connected with a same power line.

19. The wiring substrate of claim 18, wherein the functional element pad group comprises a plurality of pad sub-groups sequentially connected in series.

20. A display substrate, comprising a wiring substrate, wherein the wiring substrate comprises:
a base substrate; and
a plurality of control areas on a side of the base substrate, each of the plurality of control areas extending in a first direction, the plurality of control areas being sequentially arranged in a second direction, and any one of the plurality of control areas comprising:
a plurality of drive circuit pad groups sequentially arranged in the first direction;
a plurality of functional element pad groups, each of which is electrically connected with a corresponding drive circuit pad group;
a plurality of signal lines, main bodies of which extend in the first direction; and
first connection lines, each of which is configured to cascade two drive circuit pad groups adjacent in the first direction, wherein
an orthographic projection of the first connection line on the base substrate not overlapping with an orthographic projection of the signal line on the base substrate;
wherein the functional element pad group comprises a plurality of pad sub-groups sequentially connected in series; and
the display substrate further comprises drive circuits in binding connection with the drive circuit pad groups, and light-emitting elements in binding connection with the pad sub-groups.

* * * * *